US011018050B2

(12) United States Patent
Kim et al.

(10) Patent No.: US 11,018,050 B2
(45) Date of Patent: May 25, 2021

(54) SEMICONDUCTOR DEVICE AND METHOD OF FABRICATING THE SAME

(71) Applicant: Samsung Electronics Co., Ltd., Suwon-si (KR)

(72) Inventors: Sung Soo Kim, Hwaseong-si (KR); Chae Ho Na, Changwon-si (KR); Gyu Hwan Ahn, Seongnam-si (KR); Dong Hyun Roh, Suwon-si (KR); Sang Jin Hyun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 8 days.

(21) Appl. No.: 16/386,704

(22) Filed: Apr. 17, 2019

(65) Prior Publication Data

US 2020/0075399 A1 Mar. 5, 2020

(30) Foreign Application Priority Data

Sep. 4, 2018 (KR) .................. 10-2018-0105339

(51) Int. Cl.
*H01L 29/66* (2006.01)
*H01L 21/762* (2006.01)
*H01L 27/088* (2006.01)

(52) U.S. Cl.
CPC .... *H01L 21/76224* (2013.01); *H01L 27/0886* (2013.01); *H01L 29/66795* (2013.01)

(58) Field of Classification Search
CPC combination set(s) only.
See application file for complete search history.

(56) References Cited

U.S. PATENT DOCUMENTS

| 8,461,008 | B2 | 6/2013 | Cho |
| 9,117,877 | B2 | 8/2015 | Cai et al. |
| 9,252,044 | B2 | 2/2016 | Basker et al. |
| 9,876,077 | B1 | 1/2018 | Xie et al. |
| 9,941,279 | B2 | 4/2018 | Ching et al. |
| 9,953,879 | B1 | 4/2018 | Sung et al. |
| 2017/0025540 | A1* | 1/2017 | Liou ................. H01L 29/66545 |
| 2017/0110576 | A1* | 4/2017 | Kim .................... H01L 29/7843 |
| 2018/0108771 | A1 | 4/2018 | Bi et al. |

* cited by examiner

*Primary Examiner* — Moin M Rahman
(74) *Attorney, Agent, or Firm* — Muir Patent Law, PLLC

(57) ABSTRACT

A semiconductor device includes a substrate having first fin and a second fin spaced apart and extending lengthwise in parallel. A fin remnant is disposed between the first fin and the second fin, extends lengthwise in parallel with the first and second fins, and has a height lower than a height of each of the first fin and the second fin. A first field insulation layer is disposed between a sidewall of the first fin and a first sidewall of the fin remnant and a second field insulating layer is disposed on a sidewall of the second fin. A blocking liner conforms to a sidewall and a bottom surface of a trench bounded by a second sidewall of the fin remnant and a sidewall of the second field insulating layer. A trench insulation layer is disposed on the blocking liner in the trench.

11 Claims, 32 Drawing Sheets

SEMICONDUCTOR DEVICE AND METHOD OF FABRICATING THE SAME

CROSS-REFERENCE TO RELATED APPLICATION

This application claims priority under 35 U.S.C. § 119 to Korean Patent Application No. 10-2018-0105339 filed on Sep. 4, 2018 in the Korean Intellectual Property Office, the disclosure of which is hereby incorporated by reference in its entirety.

FIELD

Example embodiments of the present disclosure relate to a semiconductor device and a method of fabricating the same.

BACKGROUND

A semiconductor device includes integrated circuits including metal oxide semiconductor field effect transistors (MOSFETs). Reductions in semiconductor device size and design rule lead to reductions in the size of MOSFETs used in such devices. The size reduction of the MOSFETS can cause a short channel effect, which can reduce device performance. Various methods of fabricating semiconductor devices have been proposed to overcome such problems arising from higher degrees of integration to provide devices with high performance, high reliability, and low power consumption.

SUMMARY

According to some example embodiments of the inventive concepts, a semiconductor device includes a substrate having first fin and a second fin spaced apart and extending lengthwise in parallel. A fin remnant is disposed between the first fin and the second fin, extends lengthwise in parallel with the first and second fins, and has a height lower than a height of each of the first fin and the second fin. A first field insulation layer is disposed between a sidewall of the first fin and a first sidewall of the fin remnant and a second field insulating layer is disposed on a sidewall of the second fin and is spaced apart from the first field insulation layer. A blocking liner conforms to a sidewall and a bottom surface of a trench bounded by a second sidewall of the fin remnant and a sidewall of the second field insulating layer. A trench insulation layer is disposed on the blocking liner in the trench and has an upper surface lower than upper surfaces of the first field insulation layer and the second field insulation layer.

According to some example embodiments of the inventive concepts, a semiconductor device includes a substrate having a plurality of fins protruding therefrom and extending lengthwise in a first direction and spaced apart along a second direction transverse to the first direction and a field insulation layer between adjacent ones of the fins. A trench is formed in the field insulation layer and the substrate and has a bottom surface lower than a lower surface of the field insulation layer. A blocking liner conforms to the bottom surface and a sidewall of the trench, and a trench insulation layer is disposed on the blocking liner in the trench.

According to further embodiments of the inventive concepts, a semiconductor device includes a substrate having a fin remnant protruding therefrom, extending lengthwise in a first direction and having opposite first and second sidewalls. The device further includes a first field insulation layer contacting a first sidewall of the fin remnant and a second field insulation layer on the substrate and spaced apart from the first field insulation layer. A trench is bounded by the second sidewall of the fin remnant, a sidewall of the first field insulation layer and a sidewall of the second field insulation layer, the trench extending into the substrate to a depth below a lower surface of the first field insulation layer and the second field insulation layer. A blocking liner conforms to a bottom surface and inner sidewalls of the trench and a trench insulation layer is disposed on the blocking liner in the trench and has an upper surface lower than an upper surface of the first field insulation layer.

DETAILED DESCRIPTION OF THE EMBODIMENTS

Various example embodiments will now be described more fully with reference to the accompanying drawings in which some example embodiments are shown. However, the inventive concepts may be embodied in many alternate forms and should not be construed as limited to only example embodiments set forth herein.

Figure 1:
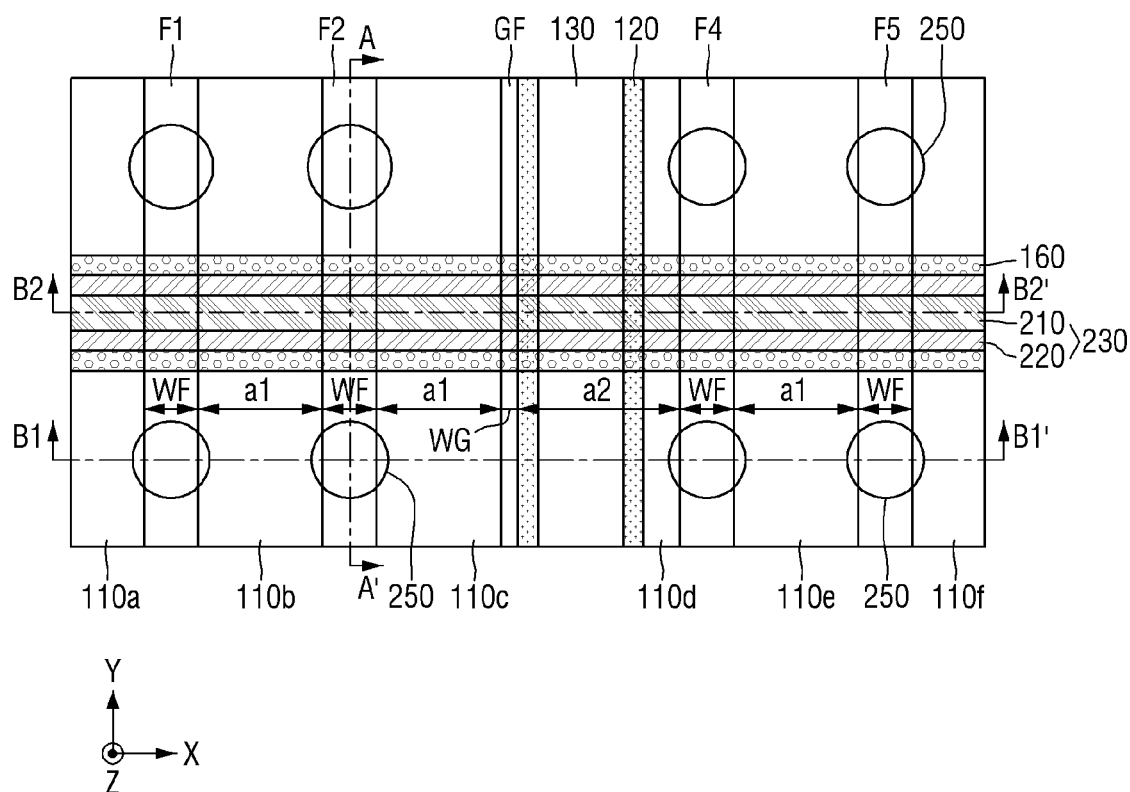
FIG. 1 is a layout diagram illustrating a semiconductor device according to example embodiments.
Figure 2:
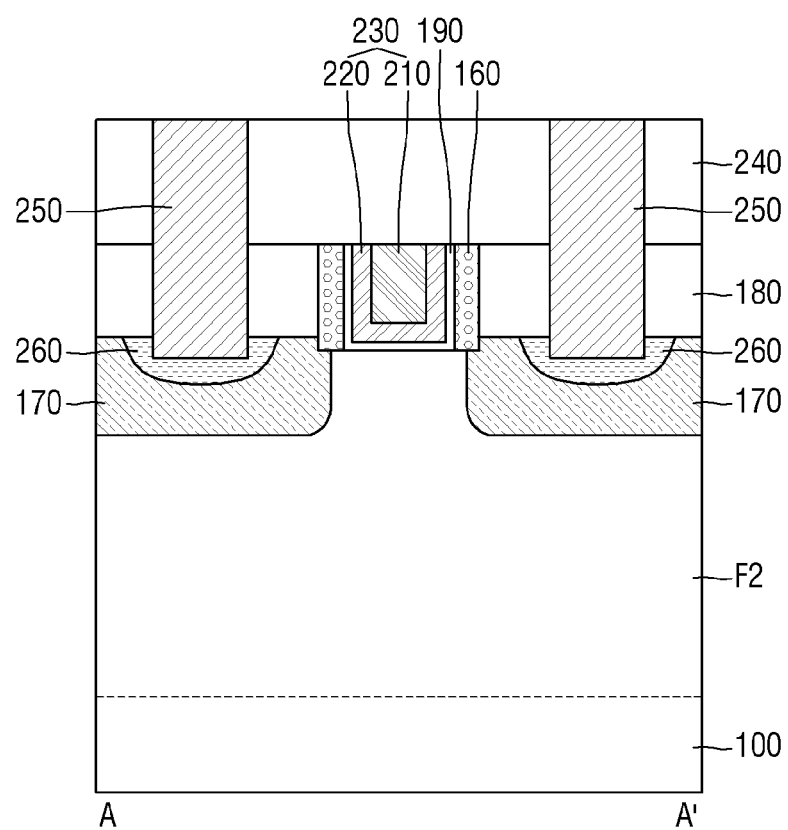
FIG. 2 is a cross-sectional view taken along line A-A' of FIG. 1, illustrating a semiconductor device according to example embodiments.
Figure 3A:
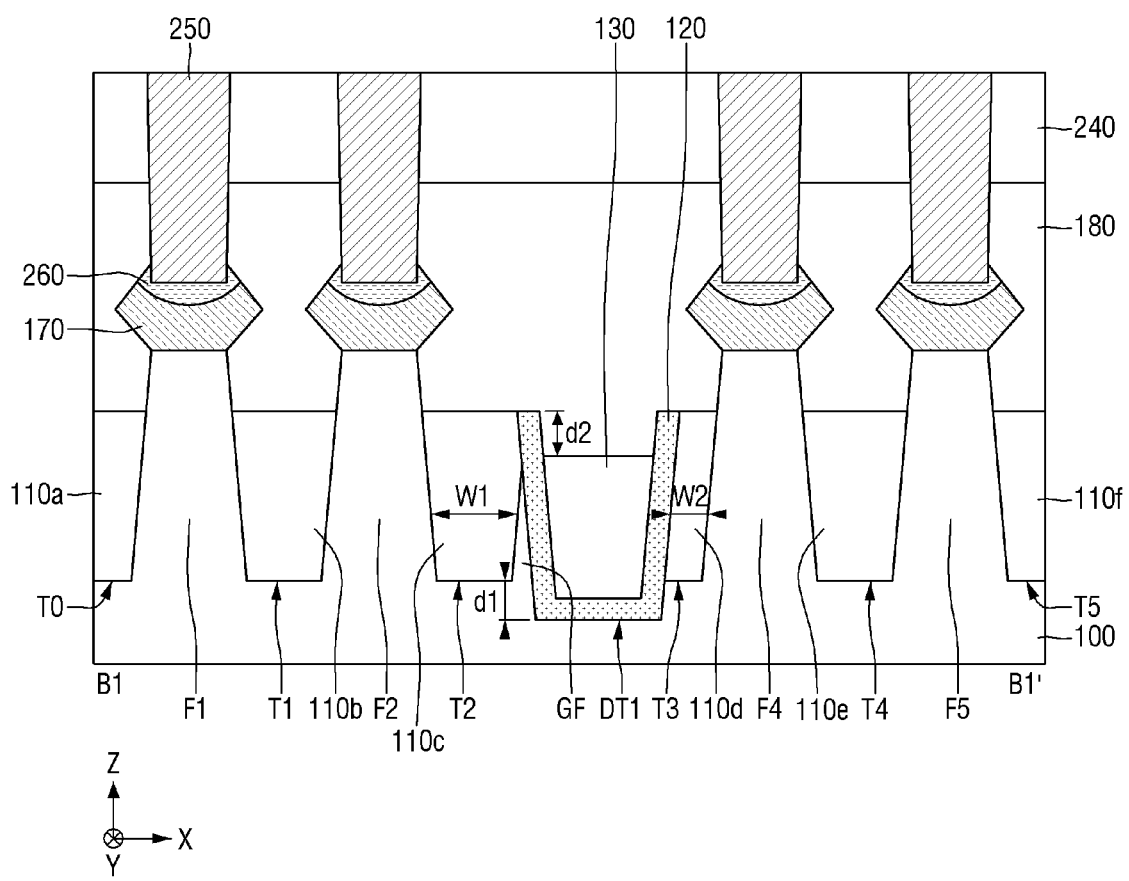
FIG. 3A is a cross-sectional view taken along line B1-B1' of FIG. 1, illustrating a semiconductor device according to example embodiments.
Figure 3B:
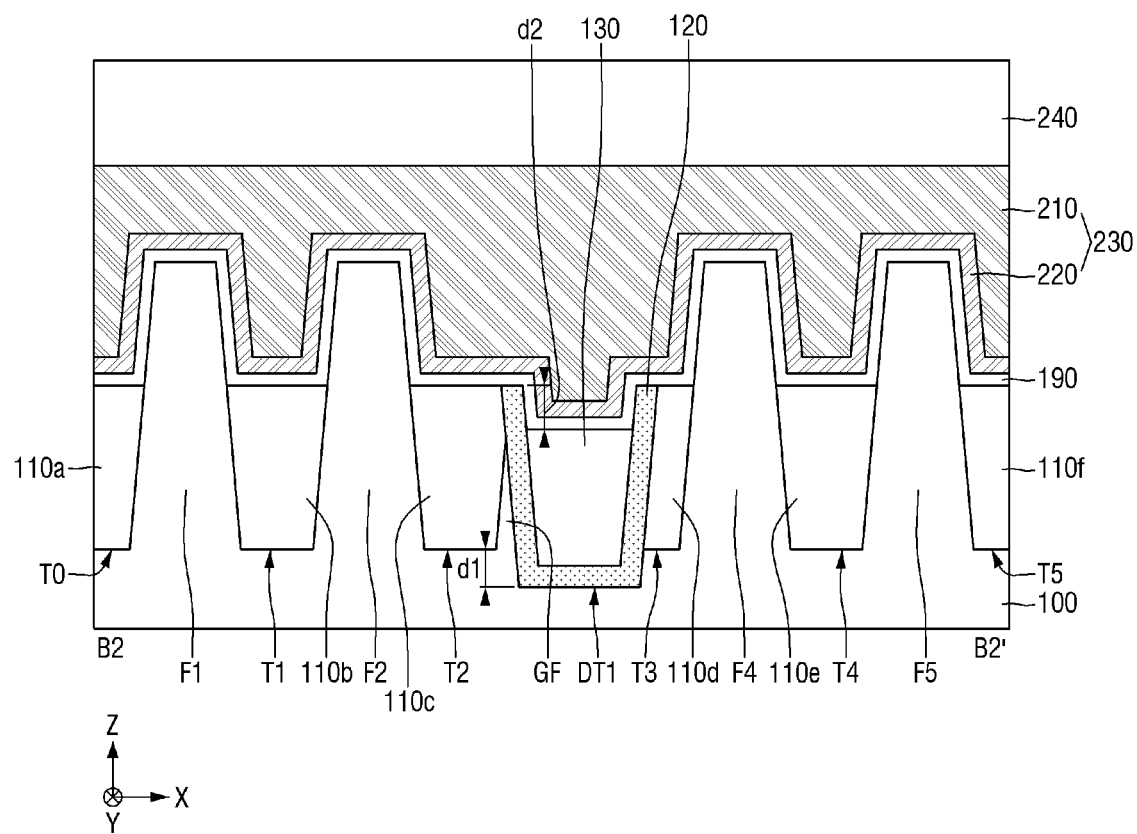
FIG. 3B is a cross-sectional view taken along line B2-B2' of FIG. 1, illustrating a semiconductor device according to example embodiments.

FIG. 1 is a layout diagram illustrating a semiconductor device according to example embodiments. FIG. 2 is a cross-sectional view taken along line A-A' of FIG. 1. FIG. 3A is a cross-sectional view taken along line B1-B1' of FIG. 1. FIG. 3B is a cross-sectional view taken along line B2-B2' of FIG. 1.

Referring to FIGS. 1, 2, and 3A, a semiconductor device according to example embodiments may include a substrate 100, first, second, fourth, and fifth fins F1, F2, F4, and F5, first, second, third, fourth, and fifth shallow trenches T0, T1, T2, T3, T4, and T5, first, second, third, fourth, fifth, and sixth field insulation layers 110*a*, 110*b*, 110*c*, 110*d*, 110*e*, and 110*f*, a first fin-cut trench DT1, a first blocking liner 120, a first fin-cut trench insulation layer 130, a "ghost fin" (fin remnant of a fin previously formed and partially removed)

GF, a gate insulation layer 190, a gate electrode 230, a spacer layer 160, source/drains 170, a first interlayer insulation layer 180, a second interlayer insulation layer 240, a silicide 260, and a contact 250.

A first direction X may be one of horizontal directions parallel to a main surface of the substrate 100. A second direction Y may be a direction crossing the first direction, for example, a direction perpendicular to the first direction X, and parallel to the main surface of the substrate 100. A third direction Z may be a direction orthogonal to all the first direction and the second direction and may be a vertical direction with respect to the main surface of the substrate 100.

The substrate 100 may include at least one of Si, Ge, SiGe, GaP, GaAs, SiC, SiGeC, InAs, and InP. In some embodiments, the substrate 100 may be a silicon on insulator (SOI) substrate.

The first, second, fourth, and fifth fins F1, F2, F4, and F5 may extend in the second direction Y and may be spaced apart from each other in the first direction X. The first, second, fourth, and fifth fins F1, F2, F4, and F5 may be sequentially arranged in the first direction X. For example, the second fin F2 may be between the first fin F1 and the fourth fin F4, and the fourth fin F4 may be between the second fin F2 and the fifth fin F5.

The ghost fin GF may extend in the second direction Y and may be between the second fin F2 and the fourth fin F4. Thus, the first fin F1, the second fin F2, the ghost fin GF, the fourth fin F4, and the fifth fin F5 may be sequentially arranged in the first direction X.

Four fins may be arranged as illustrated in the drawings, but the number of the fins according to example embodiments are not limited thereto.

The first fin F1, the second fin F2, the fourth fin F4, the fifth fin F5, and the ghost fin GF may be portions of the substrate 100 (portions protruding from the substrate 100), and may each include an epitaxial layer grown from the substrate 100. The first fin F1, the second fin F2, the fourth fin F4, the fifth fin F5, and the ghost fin GF may each be a portion protruding from the substrate 100. The first fin F1, the second fin F2, the fourth fin F4, the fifth fin F5, and the ghost fin GF may include, for example, Si or SiGe.

In some embodiments, the first fin F1, the second fin F2, the fourth fin F4, the fifth fin F5, and the ghost fin GF may include a compound semiconductor, for example, a group IV-IV compound semiconductor or a group III-V compound semiconductor. As an example of the group IV-IV compound semiconductor, the first fin F1, the second fin F2, the fourth fin F4, the fifth fin F5, and the ghost fin GF may include a binary compound or a ternary compound, each of which includes at least two of carbon (C), silicon (Si), germanium (Ge), and tin (Sn), or a compound thereof doped with a group IV element.

As an example of the group III-V compound semiconductor, the first fin F1, the second fin F2, the fourth fin F4, the fifth fin F5, and the ghost fin GF may include a binary compound, a ternary compound, or a quaternary compound, each of which is formed by combination of a group III element, for example, at least one of aluminum (Al), gallium (Ga), and indium (In) and a group V element, for example, at least one of phosphorus (P), arsenic (As), and antimony (Sb). For purposes of the following description, it will be assumed that the first fin F1, the second fin F2, the fourth fin F4, the fifth fin F5, and the ghost fin GF include silicon.

Since the ghost fin GF is a remnant of a partially removed fin, the ghost fin GF may have a different shape from the first fin F1, the second fin F2, the fourth fin F4, the fifth fin F5.

In some embodiments, the first fin F1, the second fin F2, the fourth fin F4, the fifth fin F5 may have a same fin width WF.

The ghost fin GF may have a ghost fin width WG different from the fin width WF. The ghost fin width WG may be smaller than the fin width WF. The ghost fin GF may have an uppermost portion that is sharp. Slopes of opposite sidewalls of the ghost fin GF may be different from each other. Since the third shallow trench T2 is formed at one sidewall of the ghost fin GF and the first fin-cut trench DT1 is formed at another sidewall of the ghost fin GF, lengths of the opposite sidewalls of the ghost fin GF extending in the third direction Z may be different. The length of the sidewall of the ghost fin GF exposed by the first fin-cut trench DT1 may be greater than the length of the sidewall of the ghost fin GF exposed by the third shallow trench T2.

Distances between the first fin F1, the second fin F2, the fourth fin F4, the fifth fin F5, and the ghost fin GF may be substantially the same. For example, a distance between the first fin F1 and the second fin F2, a distance between the second fin F2 and the ghost fin GF, and a distance between the fourth fin F4 and the fifth fin F5 may be equal to each other as the first distance a1.

However, a distance between the ghost fin GF and the fourth fin F4 may be a second distance a2 that is different from the first distance a1. For example, the second distance a2 may be greater than the first distance a1.

The gate electrode 230 may extend in the first direction Xl. The gate electrode 230 may be on the first fin F1, the second fin F2, the fourth fin F4, and the fifth fin F5 and may intersect the first fin F1, the second fin F2, the ghost fin GF, the fourth fin F4, and the fifth fin F5.

The first to sixth shallow trenches T0~T6 may be respectively formed on sidewalls of corresponding ones of the first fin F1, the second fin F2, the ghost fin GF, the fourth fin F4, and the fifth fin F5 in the first direction X.

For example, the first shallow trench T0 and the second shallow trench T1 may be formed on the opposite sidewalls, respectively, of the first fin F1 in the first direction X, and the second shallow trench T1 and the third shallow trench T2 may be formed on the opposite sidewalls, respectively, of the second fin F2 in the first direction X. Thus, the first fin F1 and the second fin F2 may be disposed on opposite sidewalls, respectively, of the second shallow trench T1 in the first direction X.

The fourth shallow trench T3 and the fifth shallow trench T4 may be formed on the opposite sidewalls, respectively, of the fourth fin F4 in the first direction X, and the fifth shallow trench T4 and the sixth shallow trench T5 may be formed on the opposite sidewalls, respectively, of the fifth fin F5 in the first direction X. Thus, the fourth fin F4 and the fifth fin F5 may be disposed on opposite sidewalls, respectively, of the fifth shallow trench T4 in the first direction X.

The third shallow trench T2 and the first fin-cut trench DT1 may be formed on the opposite sidewalls, respectively, of the ghost fin GF. Since a height of the ghost fin GF is lower (or smaller) than a height of each of the first, second, fourth, and fifth fins F1, F2, F4, and F5, the third shallow trench T2 and the first fin-cut trench DT1 may be communicated with each other on the ghost fin GF.

The third shallow trench T2 and the fourth shallow trench T3 may be formed on opposite sides, respectively, of the first fin-cut trench DT1. The first fin-cut trench DT1 may be communicated with the third shallow trench T2 on the ghost fin GF. Since there is not a structure like the ghost fin GF between the fourth shallow trench T3 and the first fin-cut trench DT1, the fourth shallow trench T3 and the first fin-cut trench DT1 may be entirely communicated with each other.

The first fin-cut trench DT1 may be formed deeper than the first to sixth trenches T0~T6. For example, the first fin-cut trench DT1 may be formed deeper than the first to sixth trenches T0~T6 by a first distance d1.

Since the first fin-cut trench DT1 communicates with the fourth shallow trench T3 and has a depth greater than a depth of the fourth shallow trench T3, a step may be formed between a bottom surface of the first fin-cut trench DT1 and a bottom surface of the fourth shallow trench T3. The first, second, third, fourth, fifth, and sixth field insulation layers 110a, 110b, 110c, 110d, 110c, 110d, 110e, and 110f may fill the first, second, third, fourth, fifth, and sixth trenches T0, T1, T2, T3, T4, and T5, respectively. The first to sixth field insulation layers 110a-110f may expose upper portions of the first, second, fourth, and fifth fins F1, F2, F4, and F5.

The first to sixth field insulation layers 110a-110f may include, for example, silicon oxide, silicon nitride, silicon oxynitride, and/or a low-k dielectric material having a dielectric constant less than that of silicon oxide. The low-k dielectric material may include, for example, Flowable Oxide (FOX), Tonen SilaZene (TOSZ), Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OSG), Parylene, bis-benzocyclobutenes (BCB), SiLK, polyimide, a porous polymeric material, or combinations thereof, but is not limited thereto.

The first to sixth field insulation layers 110a-110f may include a material applying a stress to the first, second, fourth, and fifth fins F1, F2, F4, and F5. When the first to sixth field insulation layers 110a-110f provide the stress to channels of transistors on the first, second, fourth, and fifth fins F1, F2, F4, and F5, a mobility of carriers, such as electrons or holes, may be increased.

The third field insulation layer 110c may have a first width W1. The fourth field insulation layer 110d may have a second width W2 less than the first width W1 by the formation of the first fin-cut trench DT1. This may be caused by a misalignment in the fin-cut process of forming the ghost fin GF.

Therefore, the ghost fin GF may be remoter from the fourth fin F4 than from the second fin F2. The ghost fin GF may be asymmetrically formed.

The first blocking liner 120 may be formed along a sidewall and a bottom surface of the first fin-cut trench DT1. The first blocking liner 120 may contact the third field insulation layer 110c, the ghost fin GF, the substrate 100 exposed on the sidewall and the bottom surface of the first fin-cut trench DT1, and the fourth field insulation layer 110d. An uppermost surface of the first blocking liner 120 may be substantially coplanar with the upper surfaces of the first to sixth field insulation layers 110a-100f. The first blocking liner 120 may include, for example, silicon nitride (SiN), polysilicon, silicon oxycarbide (SiOC), and/or titanium oxide (TiO2).

The first fin-cut trench insulation layer 130 may be formed on the first blocking liner 120. The first fin-cut trench insulation layer 130 may fill the first fin-cut trench DT1. The first fin-cut trench insulation layer 130 may include, for example, silicon oxide.

An upper surface of the first fin-cut trench insulation layer 130 may be at a lower level than the upper surfaces of the first to sixth field insulation layers 110a-110f. For example, the upper surface of the first fin-cut trench insulation layer 130 may be at a lower level than the upper surfaces of the first to sixth field insulation layers 110a-110f by a second distance d2. Thus, the upper surface of the first fin-cut trench insulation layer 130 may be at a lower level than the uppermost surface of the first blocking liner 120.

The first blocking liner 120 may include a portion contacting the first fin-cut trench insulation layer 130 and a portion exposed by (or not contacting) the first fin-cut trench insulation layer 130. The first blocking liner 120 may have an outer sidewall including a portion contacting the ghost fin GF and a portion contacting the third field insulation layer 110c at a region adjacent the ghost fin GF. The first blocking liner 120 may have an outer sidewall including a portion contacting the fourth field insulation layer 110d and a portion contacting the substrate 100 exposed on the sidewall of the first fin-cut trench DT1, at a region adjacent the fourth field insulation layer 110d.

FIG. 2 illustrates a cross-section of the second fin F2 taken along line A-A' in the second direction Y. Other fins, for example, the first fin F1, the fourth fin F4, and the fifth fin F5 may have the same cross-section as the cross-section of the second fin F2 in the second direction Y. Hereinafter, for the brevity of the description, a structure of the second fin F2 will be mainly described.

The gate insulation layer 190 may include an interfacial layer including silicon oxide and a high-k dielectric layer. The high-k dielectric layer may include a high-k dielectric material having a higher dielectric constant than that of silicon oxide. The high-k dielectric material may include, for example, at least one of silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited thereto. In some embodiments, the high-k dielectric layer may include a dipole-forming material to adjust a threshold voltage of the gate electrode. The dipole-forming material may include at least one of La, Nd, Eu, Dy, Ho, and Yb, but is not limited thereto.

The gate electrode 230 may include a first conductive layer 210 and a second conductive layer 220. The second conductive layer 220 may be formed on the gate insulation layer 190. The second conductive layer 220 may include a work function adjusting material of n-type or p-type. The work function adjusting material may include, for example, TiN, TaN, and/or TiAlC, but is not limited thereto. The first conductive layer 210 may be formed on the second conductive layer 220. The first conductive layer 210 may include W and/or TiN, but is not limited thereto.

The spacer layer 160 may be formed on opposite sidewalls of the gate electrode 230. The spacer layer 160 may be formed of a single layer or multiple layers. Each of the multiple layers forming the spacer layer 160 may have an I-shape, an L-shape, or a combination thereof depending on a fabricating process or use. The spacer layer 160 may include, for example, silicon nitride (SiN), silicon oxynitride (SiON), silicon oxide (SiO2), silicon oxycarbonitride (SiOCN), or a combination thereof.

The source/drains 170 may be formed at opposite sides of the gate electrode 230. Each of the source/drains 170 may include an epitaxial layer formed by an epitaxial process. The source/drains 170 may be elevated source/drains. In the case of an n-type transistor, the source/drains 170 may each include, for example, a silicon (Si) epitaxial layer or a silicon carbide (SiC) epitaxial layer. The source/drains 170 may each include an Si:P or SiPC doped with a high concentration of phosphorus (P). In the case of a p-type transistor, the source/drains 170 may each include a silicon germanium (SiGe) epitaxial layer. The source/drains 170 may have a diamond (e.g., a pentagonal or hexagonal), a circular, or a rectangular cross-section.

The first interlayer insulation layer 180 may cover the source/drains 170, the first to sixth field insulation layers 110a-110f, the first blocking liner 120, and the first fin-cut trench insulation layer 130. The first interlayer insulation layer 180 may fill a space between adjacent gate electrodes 230. In some embodiments, the first interlayer insulation layer 180 may fill a space between gate electrode 230 and a dummy gate electrode. An upper surface of the first interlayer insulation layer 180 may be coplanar with an upper surface of the spacer layer 160.

The second interlayer insulation layer 240 may be formed on the first interlayer insulation layer 180. The first interlayer insulation layer 180 and the second interlayer insulation layer 240 may include, for example, silicon oxide, silicon nitride, silicon oxynitride, and/or a low-k dielectric material having a lower dielectric constant than that of silicon oxide.

The contact 250 may pass through the second interlayer insulation layer 240 and the first interlayer insulation layer 180 to contact each of the source/drains 170. The contact 250 may extend into each of the source/drains 170. The silicide 260 may be formed at an interface between the contact 250 and each of the source/drains 170. The contact 250 may include a barrier metal contacting the first interlayer insulation layer 180, the second interlayer insulation layer 240 and each of the source/drains 170.

The silicide 260 may improve an interface characteristic between the contact 250 and each of the source/drains 170. The silicide 260 may be formed in each of source/drains 170 and may directly contact the contact 250.

In semiconductor devices according to example embodiments, the exposure of the ghost fin GF may be reduced or prevented by the first blocking liner 120. The ghost fin GF may be formed by the misalignment in the fin-cut process. When the ghost fin GF is exposed on the field insulation layer, the ghost fin GF may contact the source/drains 170 that are overgrown and thus may be electrically connected to (or be short-circuited with) the source/drains 170. Therefore, the reliability of the semiconductor device may be degraded.

The first fin-cut trench insulation layer 130 may be formed after the formation of the first to sixth field insulation layers 110a-110f. Thus, an additional thermal process for hardening the first fin-cut trench insulation layer 130 may not be performed because a repeated thermal stress is applied to the first to sixth field insulation layers 110a-110f. Therefore, the durability of first fin-cut trench insulation layer 130 may be lower than that of the first to sixth field insulation layers 110a-110f, and thus, the ghost fin GF may be easily exposed.

The first blocking liner 120 of the semiconductor device according to example embodiments, may be formed along the bottom surface and the sidewall of the first fin-cut trench DT1 and thus may prevent the exposure of the ghost fin GF. Therefore, the reliability of the semiconductor device may be enhanced.

Figure 4:
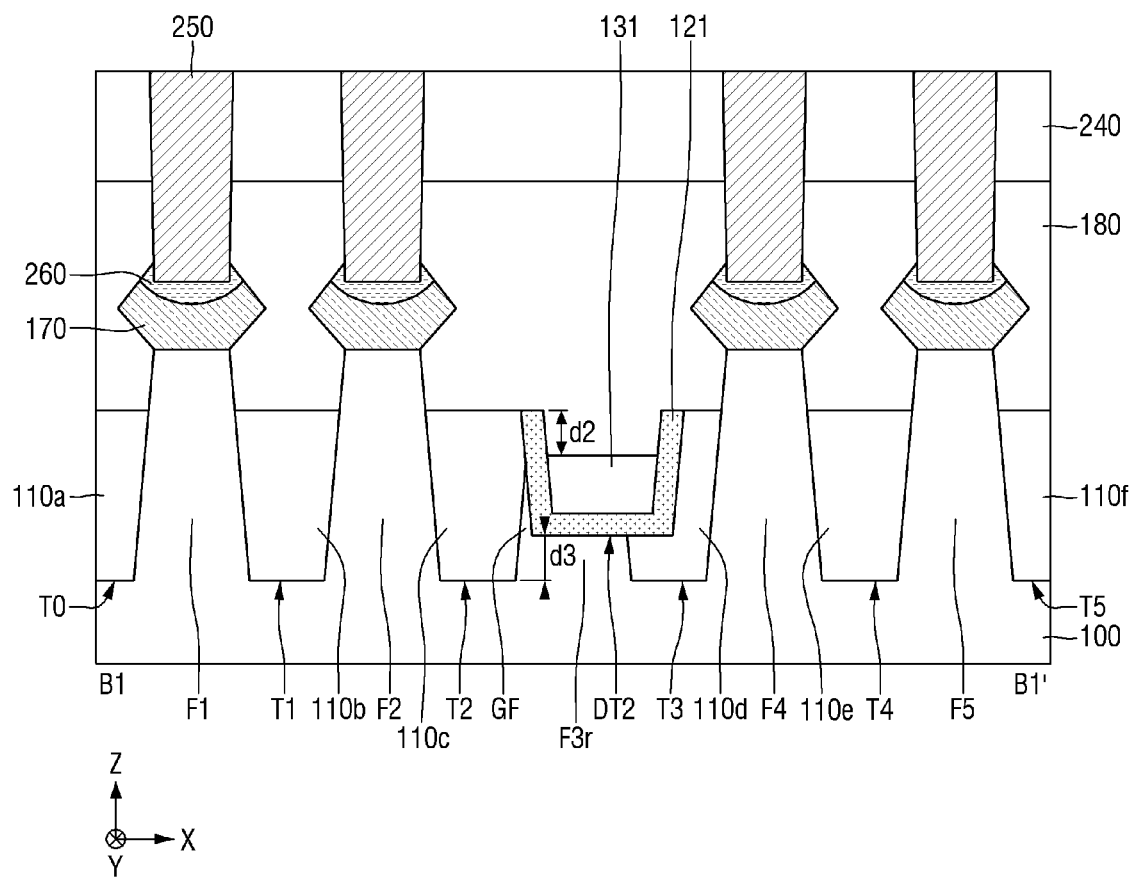
FIG. 4 is a cross-sectional view illustrating a semiconductor device according to example embodiments.

FIG. 4 is a cross-sectional view illustrating a semiconductor device according to example embodiments. For easy description, a part duplicated with the embodiments described above will be described in brief or omitted.

Referring to FIG. 4, a semiconductor device according to example embodiments may include a third fin-cut remnant F3r, a second fin-cut trench DT2, a second blocking liner 121, and a second fin-cut trench insulation layer 131. The third fin-cut remnant F3r may be a remnant of a fin partially removed in the fin-cut process. The third fin-cut remnant F3r may protrude by a third distance d3 from the main surface of the substrate 100. The ghost fin GF may further protrude from the third fin-cut remnant F3r. The ghost fin GF may protrude from a first side portion of the third fin-cut remnant F3r. A first sidewall of the ghost fin GF and a first sidewall of the third fin-cut remnant F3r may be connected to each other and may extend in the same slope direction.

The second fin-cut trench DT2 may be defined by the third fin-cut remnant F3r and the fourth field insulation layer 110d. A portion of a bottom surface of the second fin-cut trench DT2 may be an upper surface of the third fin-cut remnant F3r. The bottom surface of the second fin-cut trench DT2 may be higher than bottom surfaces of the first to sixth trenches T0~T5 by the third distance d3.

The second blocking liner 121 may extend along the bottom surface and a sidewall of the second fin-cut trench DT2. A first outer sidewall of the second blocking liner 121 may contact the third field insulation layer 110c and the ghost fin GF. A second outer sidewall of the second blocking liner 121 may contact the fourth field insulation layer 110d. A bottom surface of the second blocking liner 121 may contact the third fin-cut remnant F3r and the fourth field insulation layer 110d.

The second fin-cut trench insulation layer 131 may be formed on the second blocking liner 121. The second fin-cut trench insulation layer 131 may fill the second fin-cut trench DT2. The second fin-cut trench DT2 may include, for example, silicon oxide.

An upper surface of the second fin-cut trench insulation layer 131 may be at a lower level than upper surfaces of the first to sixth field insulation layers 110a-110f. For example, the upper surface of the second fin-cut trench insulation layer 131 may be at a lower level than the upper surfaces of the first to sixth field insulation layers 110a-110f by the second distance d2. Thus, the upper surface of the second fin-cut trench insulation layer 131 may be at a lower level than an uppermost surface of the second blocking liner 121.

Figure 5:
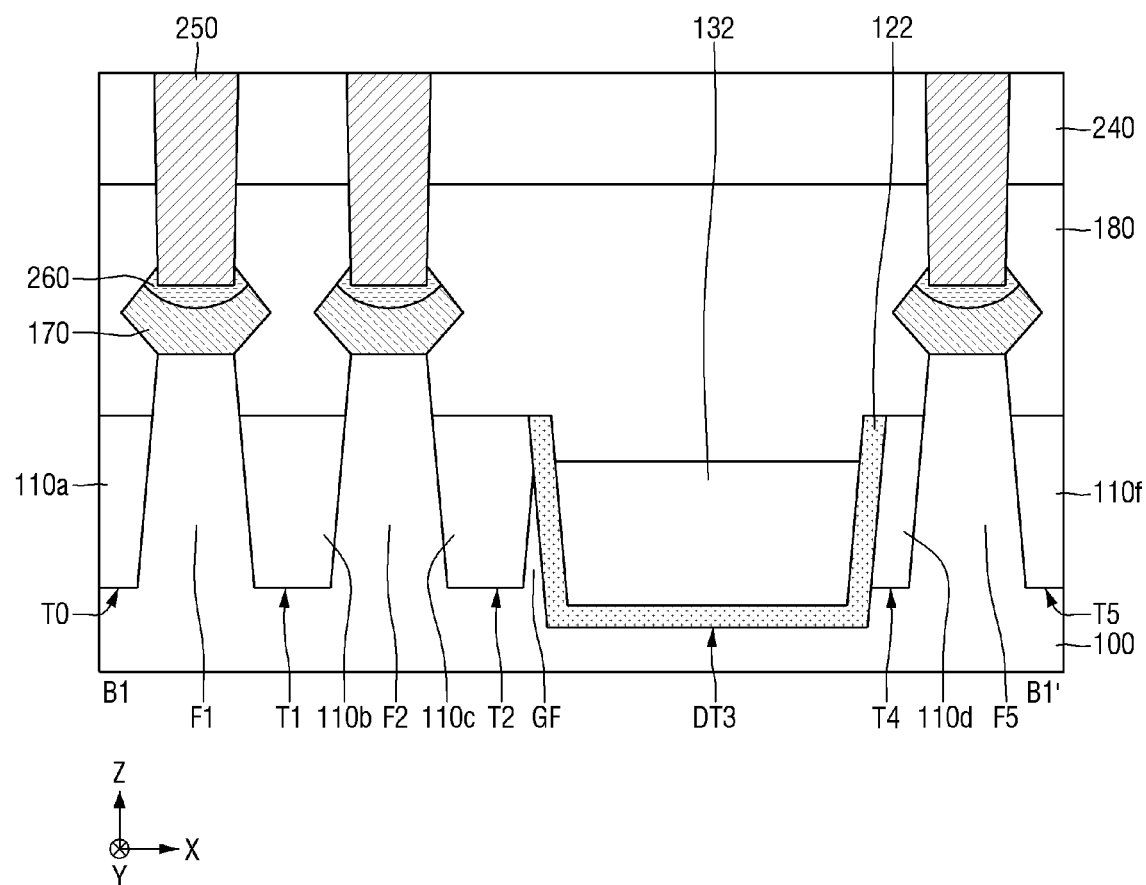
FIG. 5 is a cross-sectional view illustrating a semiconductor device according to example embodiments.

FIG. 5 is a cross-sectional view illustrating a semiconductor device according to example embodiments. For easy description, a part duplicated with the embodiments described above will be described in brief or omitted. Referring to FIG. 5, a semiconductor device according to example embodiments may include a third fin-cut trench DT3, a third blocking liner 122, and a third fin-cut trench insulation layer 132. The third fin-cut trench DT3 may be formed by removing a plurality of fins. The third fin-cut trench DT3 may be formed between the ghost fin GF and the fifth field insulation layer 110e. The third fin-cut trench DT3 may have a relatively wider width by the removal of the plurality of fins.

The third blocking liner 122 may extend along a bottom surface and a sidewall of the third fin-cut trench DT3. A first outer sidewall of the third blocking liner 122 may contact the third field insulation layer 110c and the ghost fin GF, and a second outer sidewall of the third blocking liner 122 may contact the fifth field insulation layer 110e.

The third fin-cut trench insulation layer 132 may be formed on the third blocking liner 122. The third fin-cut trench insulation layer 132 may fill the third fin-cut trench DT3. The third fin-cut trench DT3 may include, for example, silicon oxide.

Figure 6:
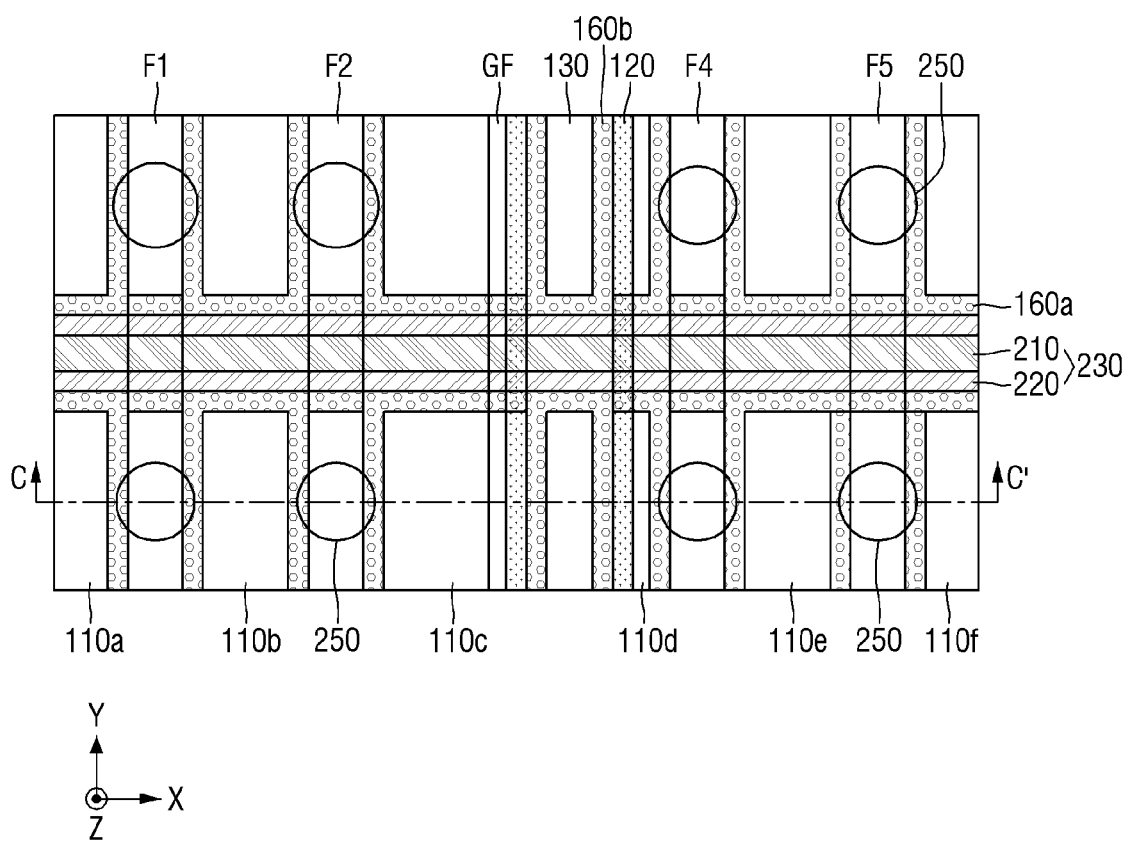
FIG. 6 is a layout diagram illustrating a semiconductor device according to example embodiments.
Figure 7:
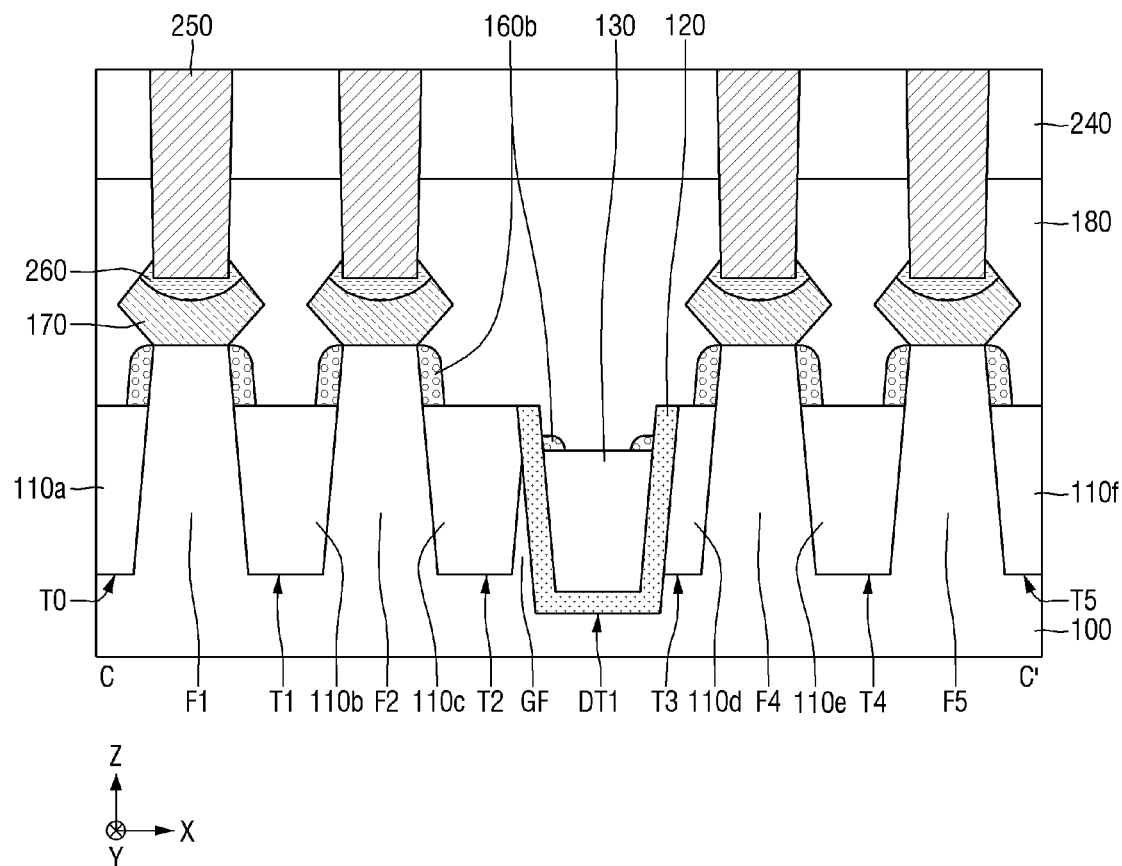
FIG. 7 is a cross-sectional view taken along line C-C' of FIG. 6, illustrating a semiconductor device according to example embodiments.

FIG. 6 is a layout diagram illustrating a semiconductor device according to example embodiments. FIG. 7 is a cross-sectional view taken along line C-C' of FIG. 6, illustrating a semiconductor device according to example embodiments. For easy description, a part duplicated with the embodiments described above will be described in brief or omitted.

Referring to FIGS. 6 and 7, a semiconductor device according to example embodiments may include a spacer layer including a gate spacer 160a and a remnant layer 160b. The gate spacer 160a may be formed on each of opposite sidewalls of the gate electrode 230 and may extend in the first direction X. The gate spacer 160a may have the same shape as the spacer layer 160 described with reference to FIGS. 1 and 2. However, the remnant layer 160b may extend in the second direction Y from the gate spacer 160a. The remnant layer 160b may be formed along sidewalls of the first fin F1, the second fin F2, the fourth fin F4, and the fifth fin F5 that are below source/drains 170.

The remnant layer 160b may be formed in the first fin-cut trench DT1. The remnant layer 160b may be formed on an upper surface of the first fin-cut trench insulation layer 130. The remnant layer 160b may extend in the second direction Y along an inner sidewall of the first blocking liner 120 exposed by the first fin-cut trench insulation layer 130.

The remnant layer 160b may be formed of the same material as the gate spacer 160a and may be integrally coupled with the gate spacer 160a. The remnant layer 160b may be formed by the same process used to form the gate spacer 160a. In some embodiments, depending on the extent of an etch process, the remnant layer 160b may not be disposed in the first fin-cut trench DT1, but may be disposed on the sidewalls of the first fin F1, the second fin F2, the fourth fin F4, and the fifth fin F5.

In some embodiments, in the case in which a height difference between the upper surface of the first fin-cut trench insulation layer 130 and upper surfaces of the first to sixth field insulation layers 110a-110f is great, depending on the extent of an etch process, the remnant layer 160b may be disposed in the first fin-cut trench DT1, but may not be disposed on the sidewalls of the first fin F1, the second fin F2, the fourth fin F4, and the fifth fin F5. In some embodiments, the remnant layer 160b may be omitted.

FIGS. 8 to 29 are cross-sectional views illustrating stages in a method of fabricating a semiconductor device according to example embodiments. FIG. 9 is a cross-sectional view taken along line D-D' of FIG. 8. FIG. 19 is a cross-sectional view taken along line E-E' of FIG. 18. FIG. 20 is a cross-sectional view taken along line F-F' of FIG. 18. FIG. 21 is a cross-sectional view corresponding to a portion taken along line G-G' of FIG. 18. FIG. 24 is a cross-sectional view taken along line H-H' of FIG. 23. FIG. 25 is a cross-sectional view taken along line I-I' of FIG. 23.

Figure 8:
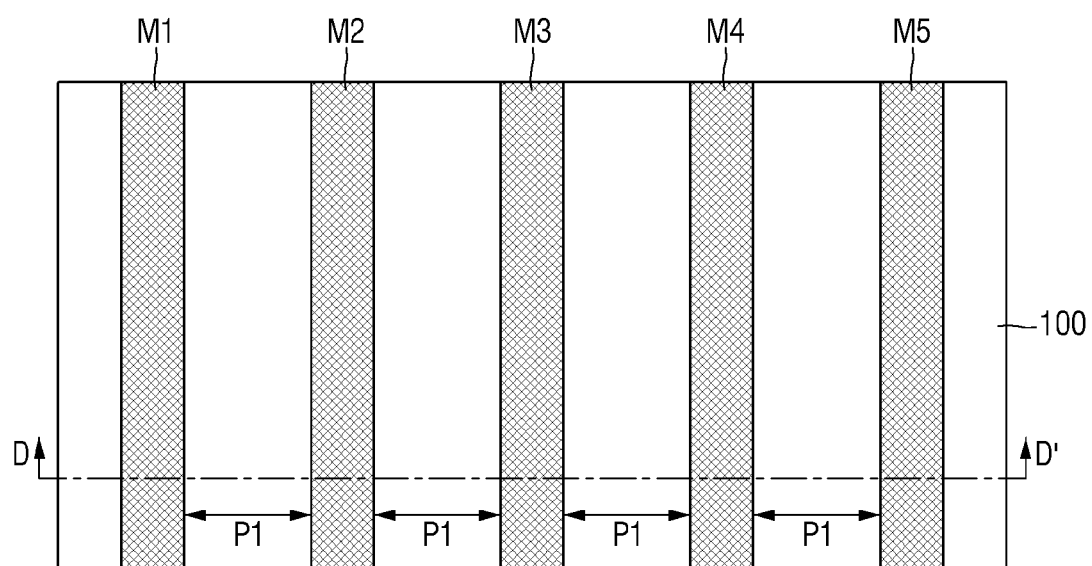
FIGS. 8 to 29 are cross-sectional views illustrating stages in a method of fabricating a semiconductor device according to example embodiments.
Figure 9:
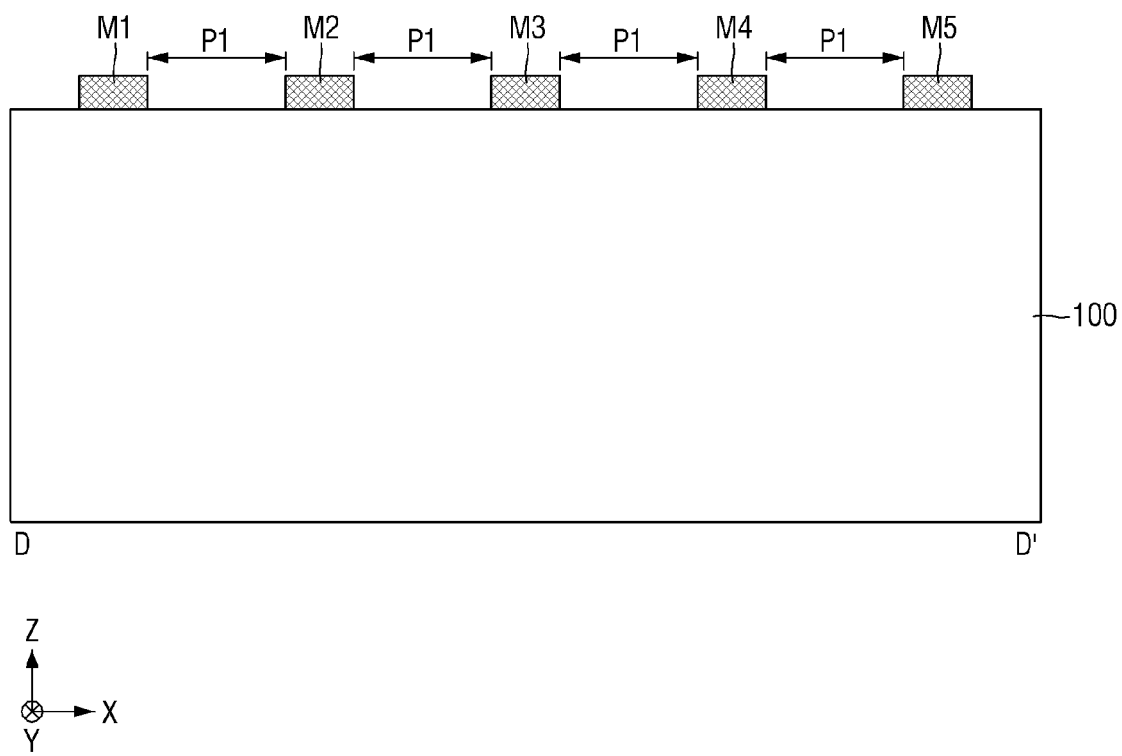

Referring to FIGS. 8 and 9, first to fifth masks M1~M5 may be formed on a substrate 100. The substrate 100 may include at least one of Si, Ge, SiGe, GaP, GaAs, SiC, SiGeC, InAs, and InP. In some embodiments, the substrate 100 may be a silicon on insulator (SOI) substrate.

The first to fifth masks M1~M5 may be spaced apart a first distance P1. The first to fifth masks M1 M5 may extend in the second direction Y and may be spaced apart from each other in the first direction X. The first to fifth masks M1~M5 may be sequentially arranged in the first direction X. Five masks are illustrated in the drawings, but the number of the masks is not limited thereto.

Figure 10:
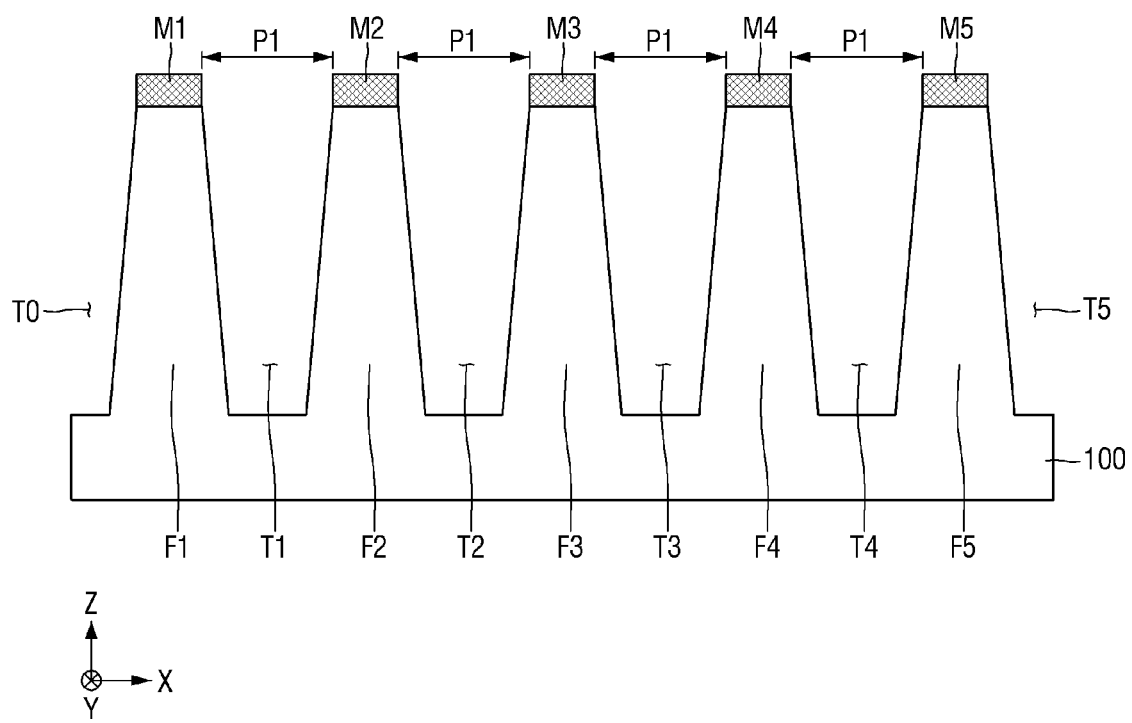

Referring to FIG. 10, the substrate 100 may be etched using the first to fifth masks M1~M5 as an etch mask. By etching the substrate 100, the first to fifth fins F1~F5 and the first to sixth shallow trenches T0~T5 may be formed. For example, the first fin F1 may be between the first shallow trench T0 and the second shallow trench T1 in the first direction X, and the second fin F2 may be between the second shallow trench T1 and the third shallow trench T2 in the first direction X. The third fin F3 may be between the third shallow trench T2 and the fourth shallow trench T3 in the first direction X, and the fourth fin F2 may be between the fourth shallow trench T3 and the fifth shallow trench T4 in the first direction X. The fifth fin F5 may be between the fifth shallow trench T4 and the sixth shallow trench T5.

The second shallow trench T1 may be defined by the first fin F1 and the second fin F2. The third shallow trench T2 may be defined by the second fin F2 and the third fin F3. The fifth shallow trench T4 may be defined by the fourth fin F4 and the fifth fin F5.

Figure 11:
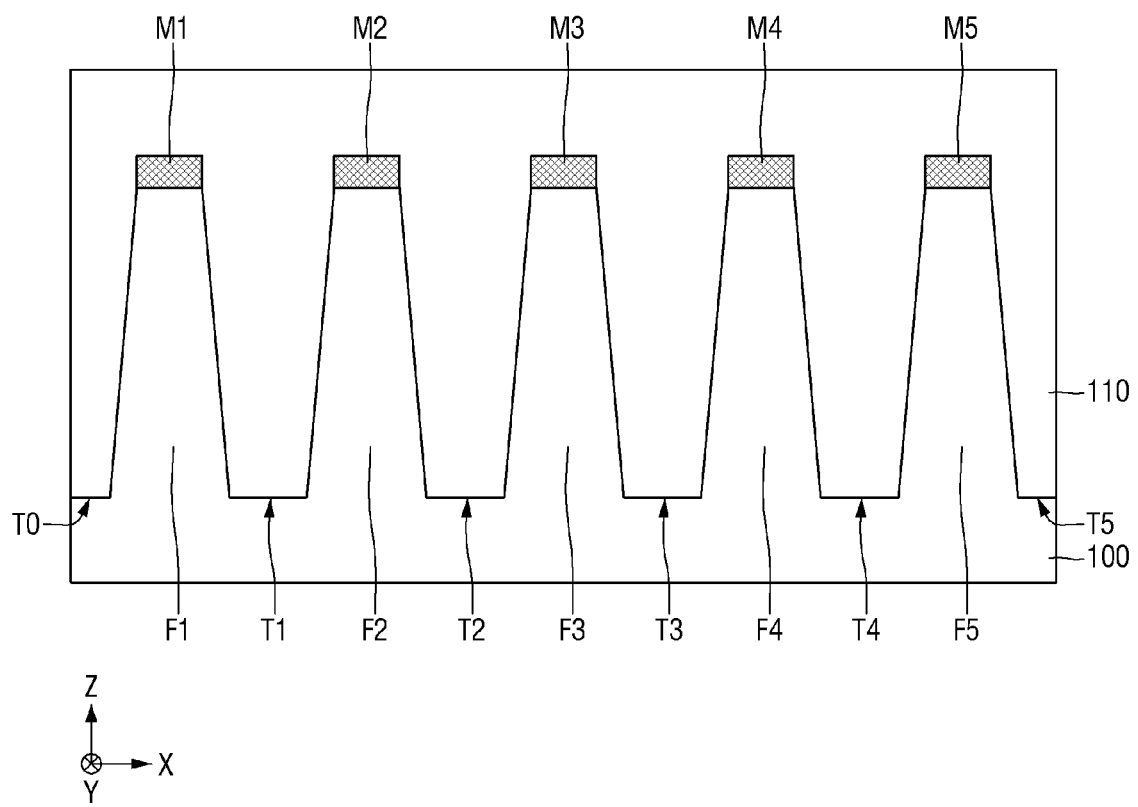

Referring to FIG. 11, a field insulation layer 110 may be formed. The field insulation layer 110 may include, for example, silicon oxide, silicon nitride, silicon oxynitride, and/or a low-k dielectric material having a dielectric constant less than that of silicon oxide. The low-k dielectric material may include, for example, Flowable Oxide (FOX), Tonen SilaZene (TOSZ), Undoped Silica Glass (USG), Borosilica Glass (BSG), PhosphoSilica Glass (PSG), Boro-PhosphoSilica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OSG), Parylene, bis-benzocyclobutenes (BCB), SiLK, polyimide, porous polymeric material, or combinations thereof, but is not limited thereto. The field insulation layer 110 may completely fill the first to sixth trenches T0~T5. The field insulation layer 110 may cover the first to fifth fins F1~F5 and the first to fifth masks M1~M5.

Figure 12:
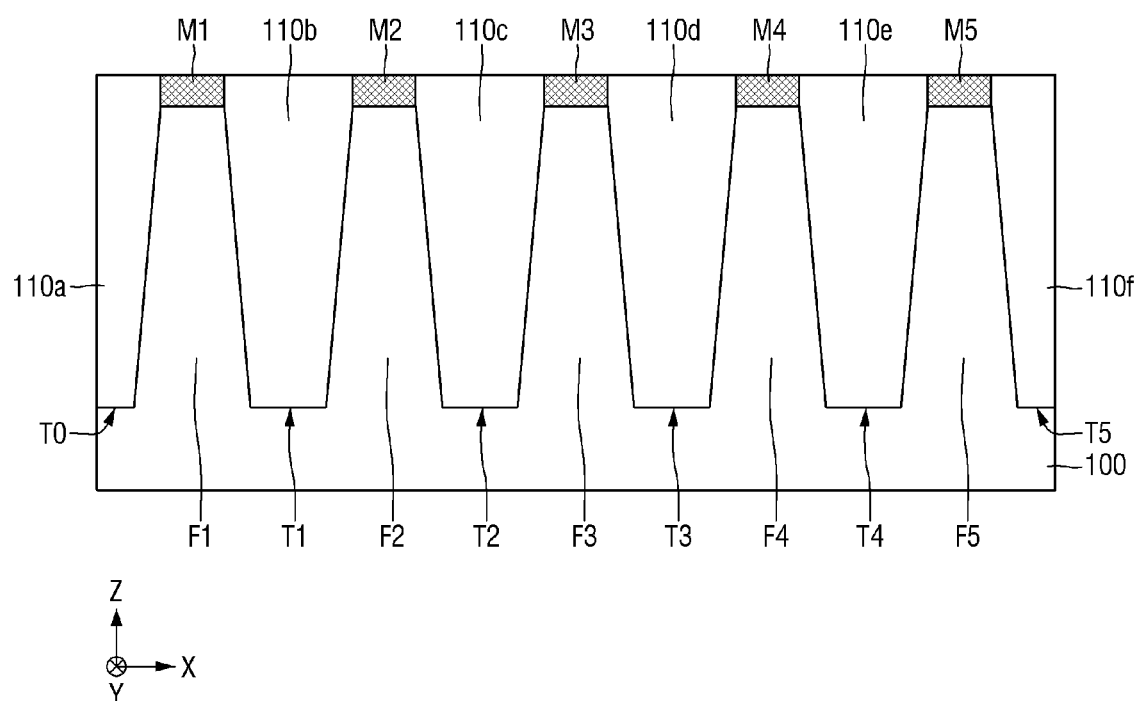

Referring to FIG. 12, a planarization process may be performed on the field insulation layer 110 to expose upper surfaces of the first to fifth masks M1~M5. The planarization process may include a chemical mechanical polishing (CMP) process. The field insulation layer 110 may be separated into the first to sixth field insulation layers 110a-110f through the planarization process. Upper surfaces of the first to sixth field insulation layers 110a-110f may be coplanar with the upper surfaces of the first to fifth masks M1~M5 through the planarization process. The first to sixth field insulation layers 110a-110f may respectively fill corresponding ones of the first to sixth shallow trenches T0~T5.

Figure 13:
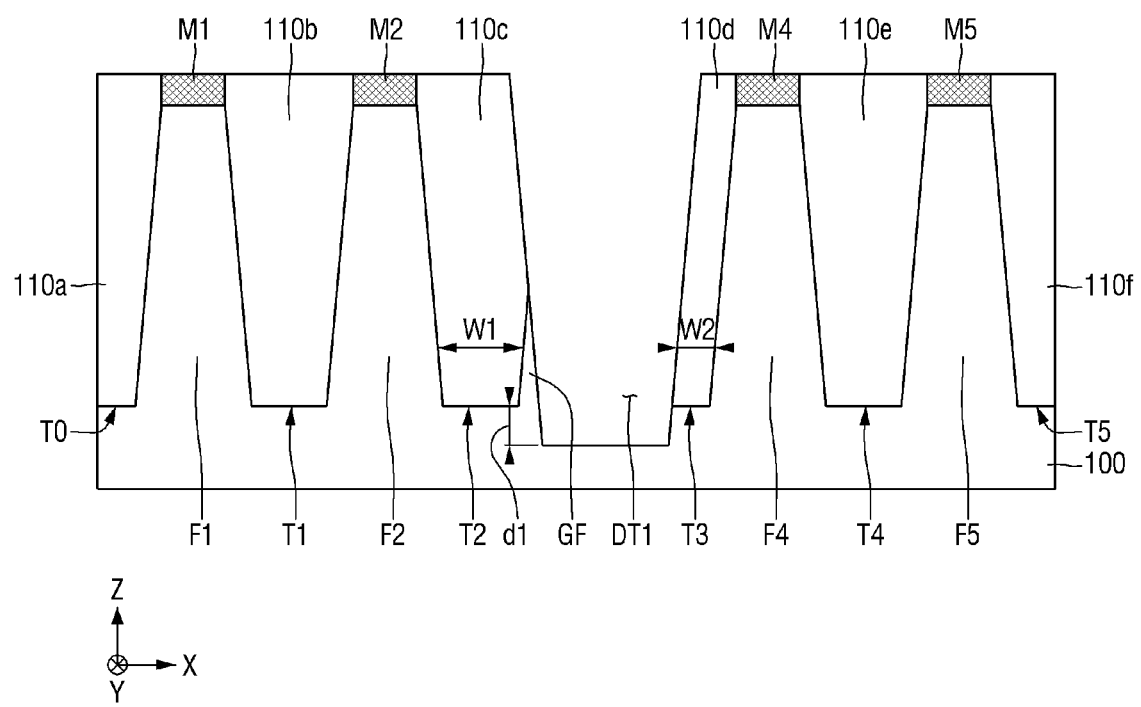

Referring to FIG. 13, the first fin-cut trench DT1 may be formed. The first fin-cut trench DT1 may be formed while completely removing the third mask M3. The first fin-cut trench DT1 may be formed while removing a portion of the third fin F3, a portion of the third field insulation layer 110c, and a portion of the fourth field insulation layer 110d.

Because of misalignment, the first fin-cut trench DT1 may be formed at a location that is displaced from a target location toward the fourth fin F4. Thus, the third fin F3 may not be completely removed, and a ghost fin GF may be formed. In addition, a first width W1 of the third field insulation layer 110c may be greater than a second width W2 of the fourth field insulation layer 110d.

The first fin-cut trench DT1 may be misaligned toward the fourth fin F4 as shown in FIG. 13, but example embodiments are not limited thereto. For example, the first fin-cut trench DT1 may be misaligned toward the third fin F3. In this case, the ghost fin GF may be formed adjacent to the fourth fin F4. In addition, the first width W1 of the third field insulation layer 110c may be smaller than the second width W2 of the fourth field insulation layer 110d.

The first fin-cut trench DT1 may be formed deeper than the first to sixth shallow trenches T0~T5. For example, the first fin-cut trench DT1 may be formed deeper than the first to sixth shallow trenches T0~T6 by the first distance d1.

Figure 14:
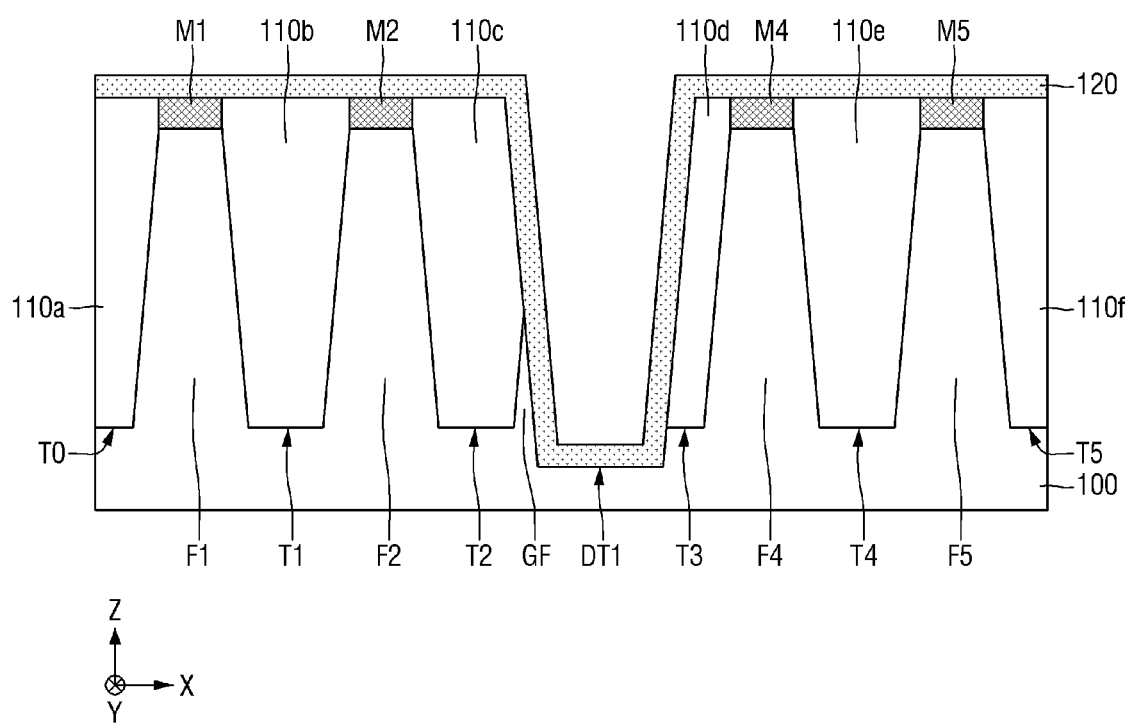

Referring to FIG. 14, the first blocking liner 120 may be formed. The first blocking liner 120 may be formed along a sidewall and a bottom surface of the first fin-cut trench DT1. The first blocking liner 120 may contact the third field insulation layer 110c, the ghost fin GF, the fourth field insulation layer 110d, and the substrate 100 exposed on the bottom surface and the sidewall of the first fin-cut trench DT1. The first blocking liner 120 may extend along the upper surfaces of the first to sixth field insulation layers 110a-110f and the upper surfaces of the first, second, fourth, and fifth masks M1, M2, M4, and M5.

The first blocking liner 120 may have an outer sidewall including a portion contacting the ghost fin GF and a portion contacting the third field insulation layer 110c at a region adjacent the ghost fin GF. The first blocking liner 120 may have an outer sidewall including a portion contacting the fourth field insulation layer 110d and a portion contacting the substrate 100 exposed on the sidewall of the first fin-cut trench DT1, at a region adjacent the fourth field insulation layer 110d. The first blocking liner 120 may include, for example, silicon nitride (SiN), polysilicon, silicon oxycarbide (SiOC), and/or titanium oxide ($TiO_2$), but is not limited thereto.

Figure 15:
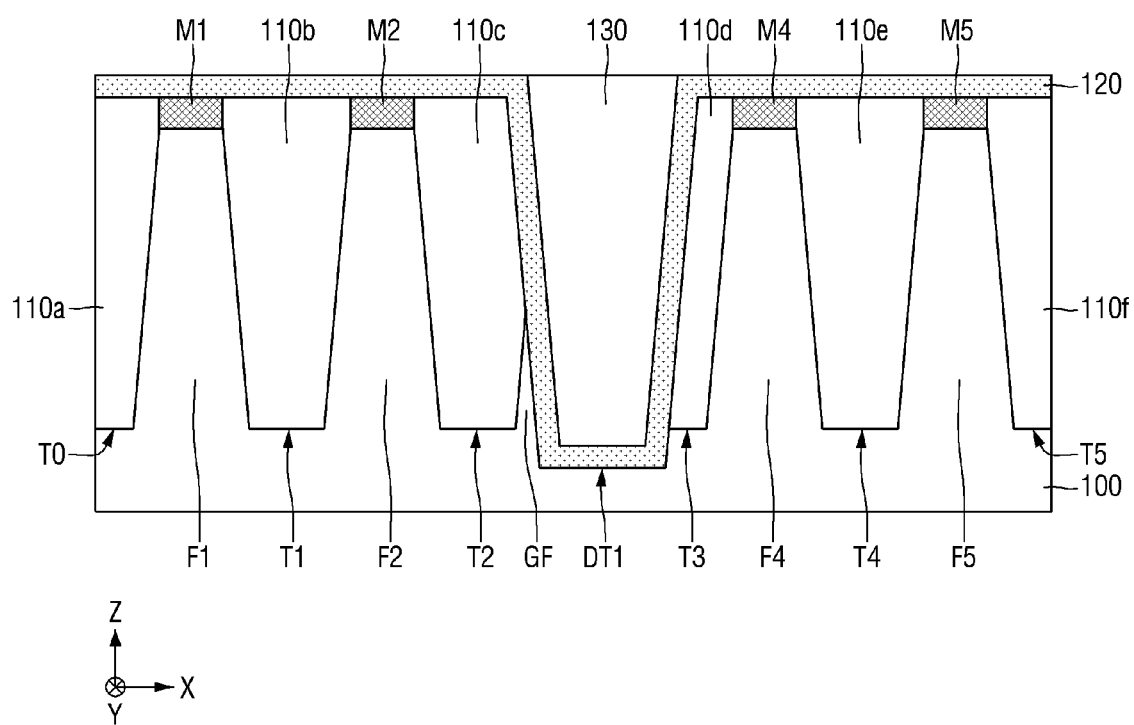

Referring to FIG. 15, the first fin-cut trench insulation layer 130 may be formed. The first fin-cut trench insulation layer 130 may be formed on the first blocking liner 120. The first fin-cut trench insulation layer 130 may completely fill the first fin-cut trench DT1. The first fin-cut trench insulation layer 130 may include, for example, silicon oxide. The first fin-cut trench insulation layer 130 may include a material having the same composition as the first to sixth field insulation layers 110a~110f.

The durability of the first fin-cut trench insulation layer 130 may be lower than that of the first to sixth field insulation layers 110a-110f. Therefore, an etch rate of the first fin-cut trench insulation layer 130 may be greater than that of the first to sixth field insulation layers 100a-100f. In the case in which the first blocking liner 120 is not present, the first fin-cut trench insulation layer 130 may be over-etched by a subsequent etch process. Accordingly, the ghost fin GF may be exposed, and thus may be short-circuited with source/drains to be formed in the following process.

However, in semiconductor devices according to example embodiments, a first blocking liner 120 is present and may compensate for the lack of etching resistance of the first fin-cut trench insulation layer 130. The first blocking liner 120 may include a material having an etch selectivity with respect to the first fin-cut trench insulation layer 130. Thus, even though the first fin-cut trench insulation layer 130 may be over-etched, the ghost fin GF may not be exposed due to the protection of the first blocking liner 120. Therefore, semiconductor devices may be more reliably manufactured.

Figure 16:
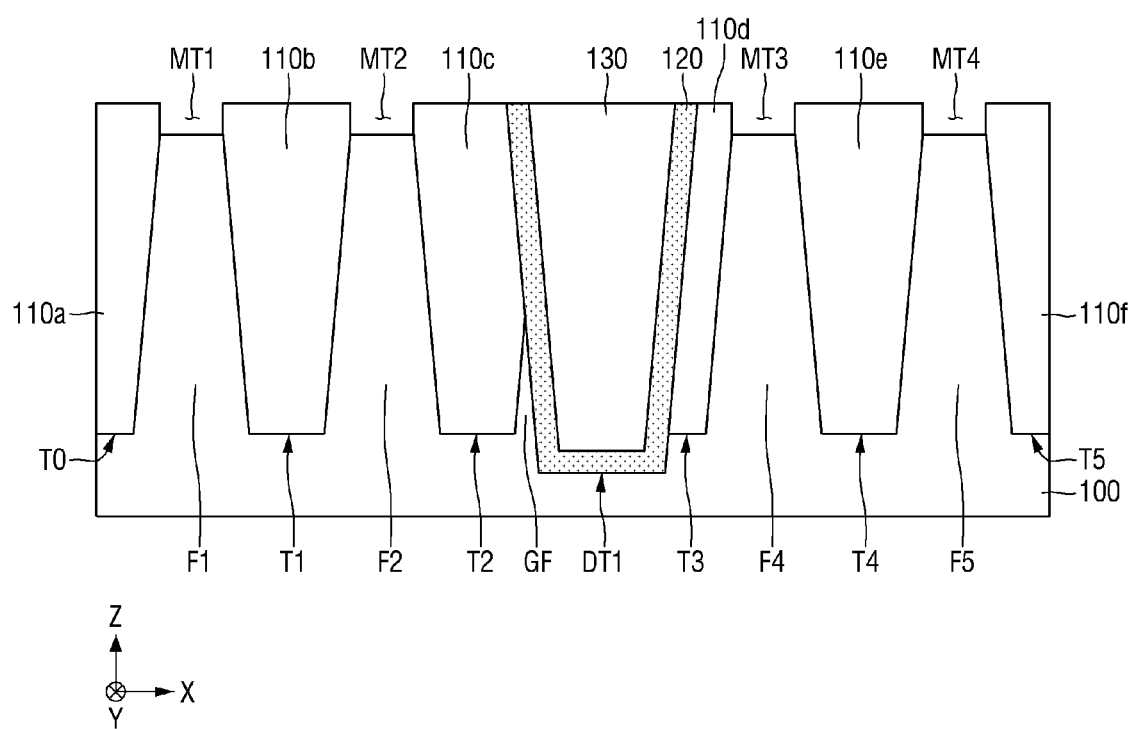

Referring to FIG. 16, the first, second, fourth, and fifth masks M1, M2, M4, and M5 may be removed. A portion of the first blocking liner 120 may be removed to expose the upper surfaces of the first second, fourth, and fifth masks M1, M2, M4, and M5. At that time, a portion of an upper portion of the first fin-cut trench insulation layer 130 may be removed together with the portion of the first blocking liner 120 through a planarization process.

Thereafter, the first second, fourth, and fifth masks M1, M2, M4, and M5 may be removed. Thus, upper surfaces of the first fin F1, the second fin F2, the fourth fin F4, and the fifth fin F5 may be exposed, and first to fourth mask trenches MT1~MT4 may be formed at respective regions from which the first, second, fourth, and fifth masks M1, M2, M4, and M5 are removed Referring to FIG. 17, portions of the first to sixth field insulation layers 110a-110f, a portion of the first blocking liner 120, and a portion of the first fin-cut trench insulation layer 130 may be removed. Thus, upper portions of the first fin F1, the second fin F2, the fourth fin F4, and the fifth fin F5 may be exposed. For example, the first fin F1, the second fin F2, the fourth fin F4, and the fifth fin F5 may each include a first fin portion Fa and a second fin Fb. The first fin portions Fa may be exposed portions not covered by the first to sixth field insulation layers 110a-110f. The second fin portions Fb may be portions covered by the first to sixth field insulation layers 110a-110f.

The first blocking liner 120 may be removed at the same etch rate as the first to sixth field insulation layers 110a-110f. Thus, an uppermost surface of the first blocking liner 120 may be substantially coplanar with the upper surfaces of the first to sixth field insulation layers 110a-110f. However, since the first fin-cut trench insulation layer 130 may have a relatively high etch rate, an upper surface of the first fin-cut trench insulation layer 130 may be at a lower level than the upper surfaces of the first to sixth field insulation layers 110a-11f and the uppermost surface of the first blocking liner 120. For example, the upper surface of the first fin-cut trench insulation layer 130 may be at a lower level than the upper surfaces of the first to sixth field insulation layers 110a-110f by the second distance d2.

An inner sidewall of the first blocking liner 120 may include a first portion 120a and a second portion 120b. The first portion 120a of the inner sidewall of the first blocking liner 120 may be a first exposed portion not covered by the first fin-cut trench insulation layer 130 and the second portion 120b may be covered by the first fin-cut trench insulation layer 130.

An outer sidewall of the first blocking liner 120 may include a third portion 120c and a fourth portion 120d. The third portion 120c of the outer sidewall of the first blocking liner 120 may directly contact the third field insulation layer 110c, and the fourth portion 120d thereof may directly contact the ghost fin GF.

Figure 17:
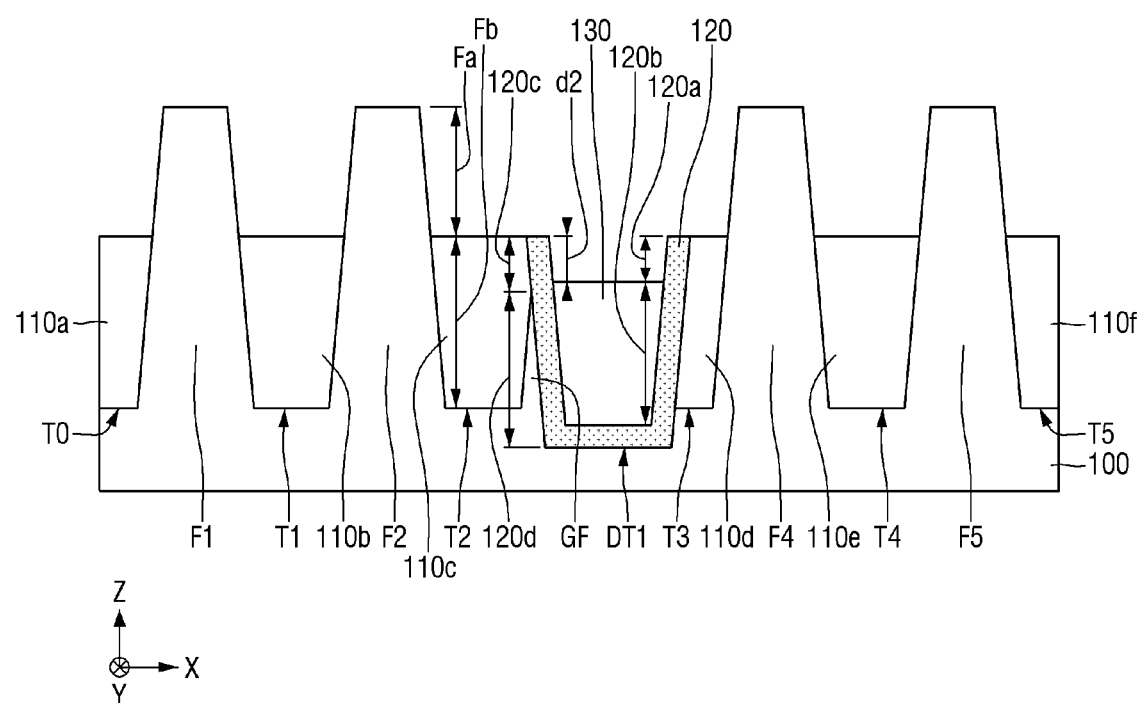

As show in FIGS. 16 and 17, after the first, second, fourth, and fifth masks M1, M2, M4, and M5 are removed, portions of the first to sixth field insulation layers 110a-110f, a portion of the first blocking liner 120, and a portion of the first fin-cut trench insulation layer 130 may be removed, but example embodiments are not limited thereto.

In some embodiments, operations for fabricating semiconductor devices according to example embodiments may include removing portions of the first to sixth field insulation layers 110a-110f, a portion of the first blocking liner 120, and a portion of the first fin-cut trench insulation layer 130, and then removing the first, second, fourth, and fifth masks M1, M2, M4, and M5.

Figure 18:
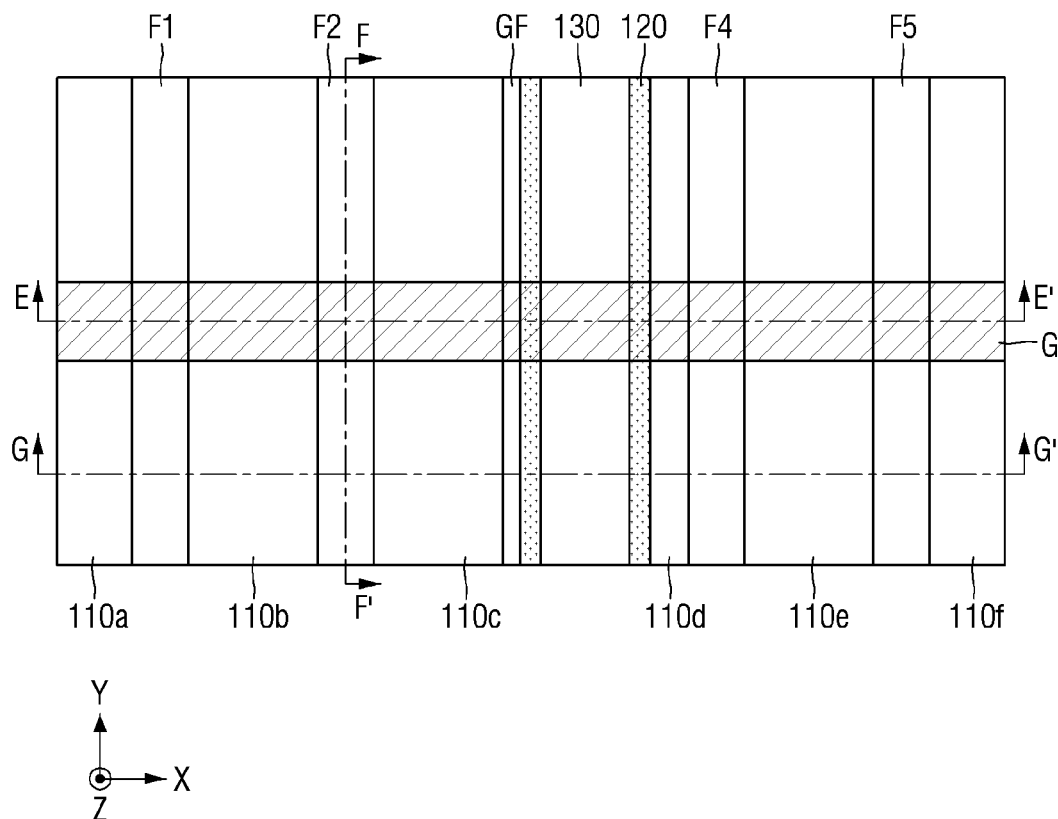
Figure 19:
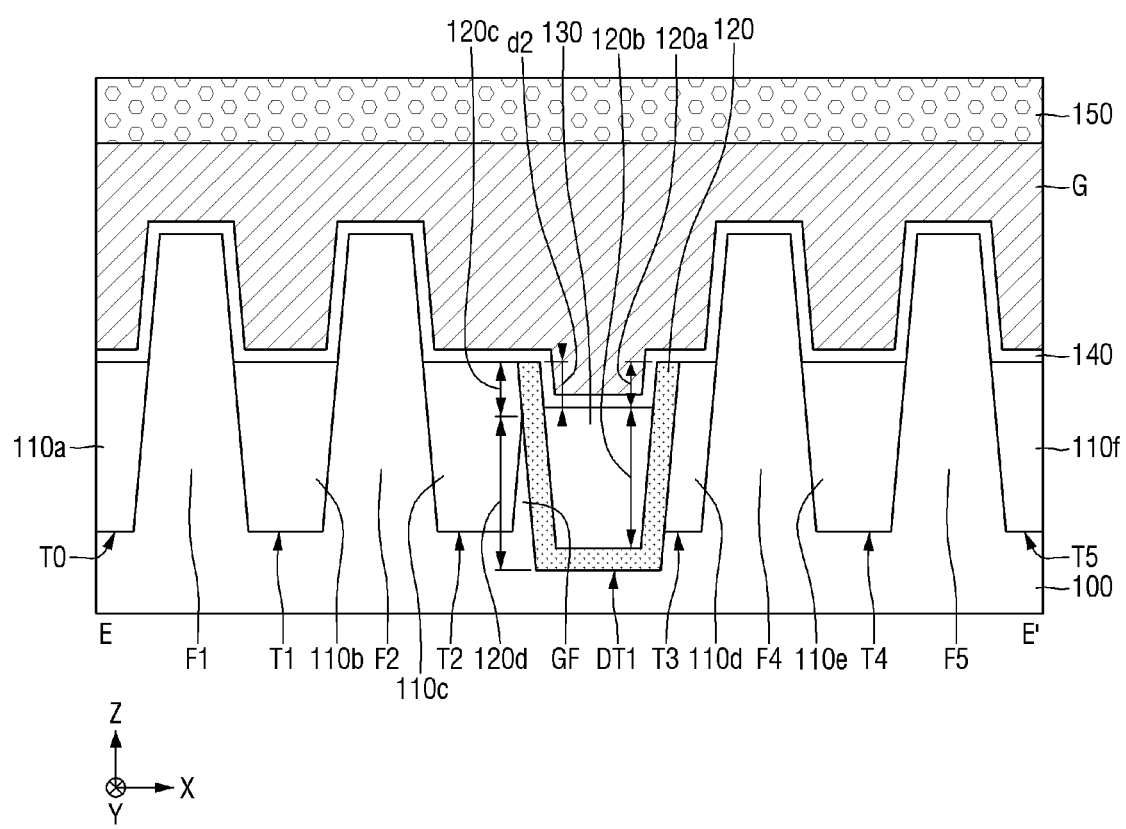
Figure 20:
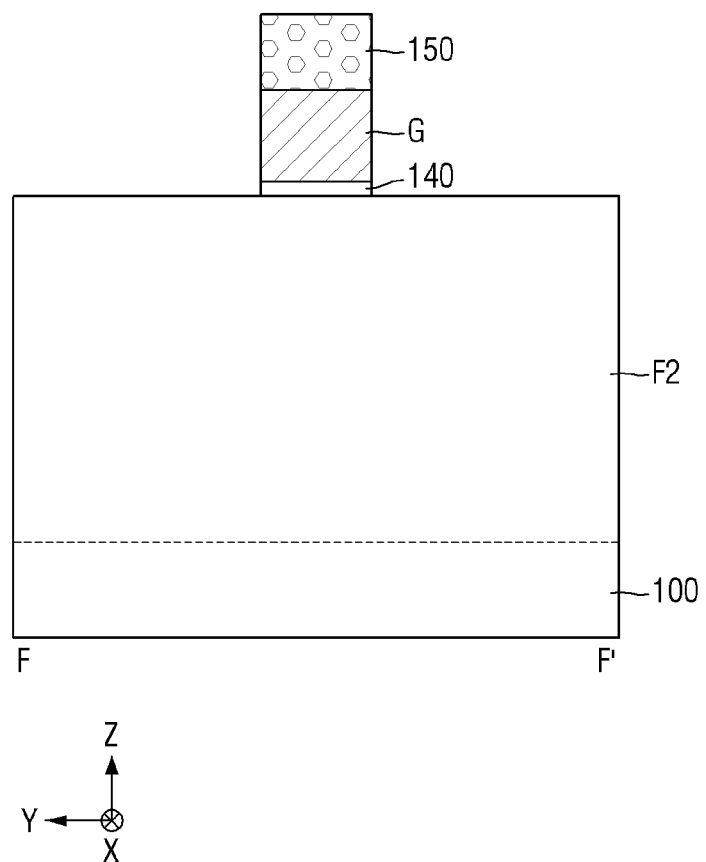
Figure 21:
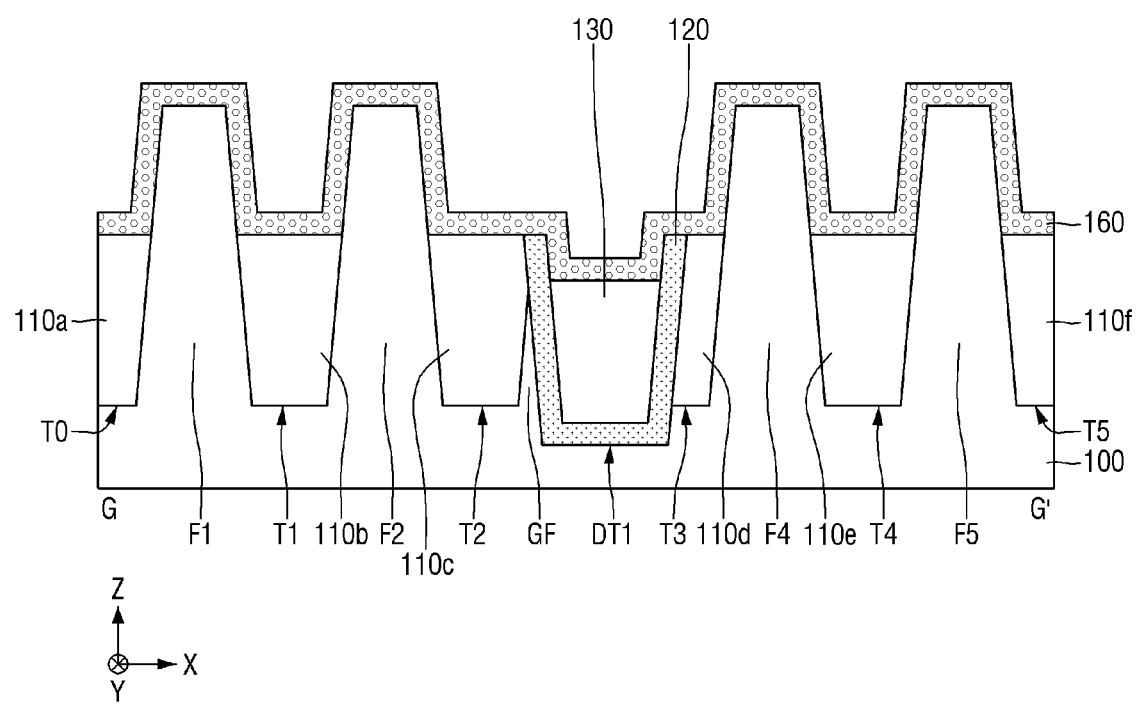

Referring to FIGS. 18 to 20, a dummy gate insulation layer 140, a dummy gate G, and a capping layer 150 may be formed. The dummy gate insulation layer 140, the dummy gate G, and the capping layer 150 may be sequentially stacked on the first fin F1, the second fin F2, the fourth fin F4, the fifth fin F4, the first to sixth field insulation layers 110a-110f, the first blocking liner 120, and the first fin-cut trench insulation layer 130. The dummy gate insulation layer 140, the dummy gate G, and the capping layer 150 may extend in the first direction X. The dummy gate insulation layer 140 may be formed along the surfaces of the first fin F1, the second fin F2, the fourth fin F4, the fifth fin F5, the first to sixth field insulation layers 110a-110f, the first blocking liner 120, and the first fin-cut trench insulation layer 130. The dummy gate insulation layer 140 may be an insulation layer.

The dummy gate G may be formed on the dummy gate insulation layer 140. The dummy gate G may include, for example, polysilicon, but is not limited thereto.

The capping layer 150 may be formed on the dummy gate G. The capping layer 150 may include, for example, silicon nitride, but is not limited thereto.

The dummy gate insulation layer 140, the dummy gate G, and the capping layer 150 may be patterned together. Thus, the dummy gate insulation layer 140, the dummy gate G, and the capping layer 150 may have substantially the same shape in plan view.

Figure 22:
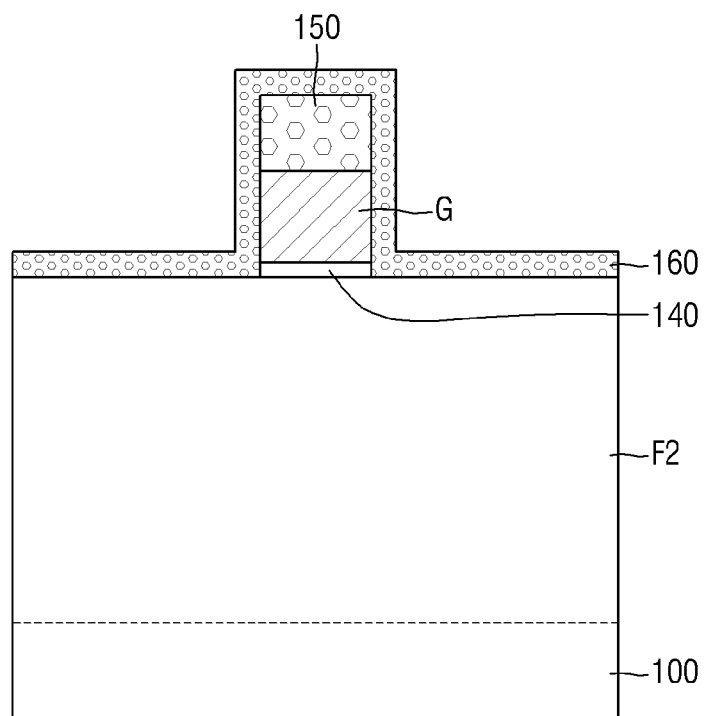

FIG. 21 is a cross-sectional view corresponding to a portion taken along line G-G' of FIG. 18. FIG. 22 is a cross-sectional view corresponding to FIG. 20. Referring to FIGS. 21 and 22, a spacer layer 160 may be formed. The spacer layer 160 may cover an upper surface and a sidewall of the capping layer 150, a sidewall of the dummy gate G, and a sidewall of the dummy gate insulation layer 140. The spacer layer 160 may cover upper surfaces and sidewalls of the first fin F1, the second fin F2, the fourth fin F4, and the fifth fin F5, and the upper surfaces of the first to sixth field insulation layers 110a-110f, the first fin-cut trench insulation layer 130, and the uppermost surface and a portion of the inner sidewall of the first blocking liner 120.

Figure 23:
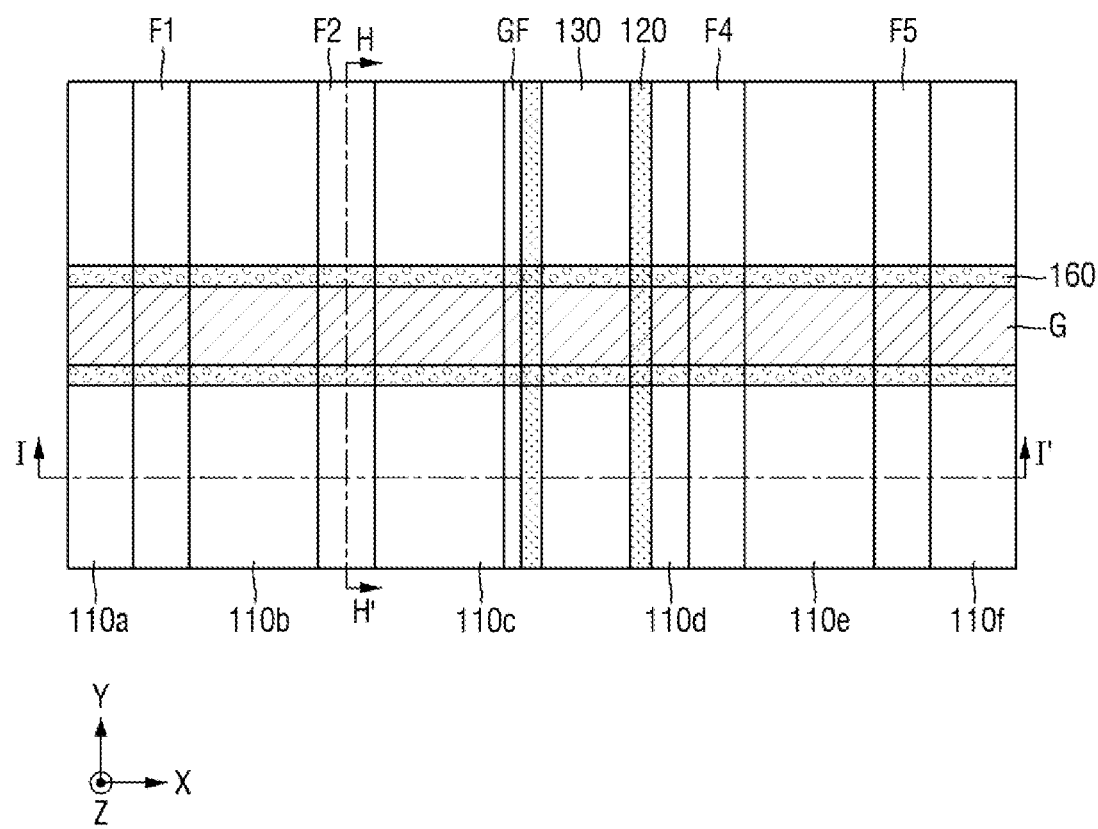
Figure 24:
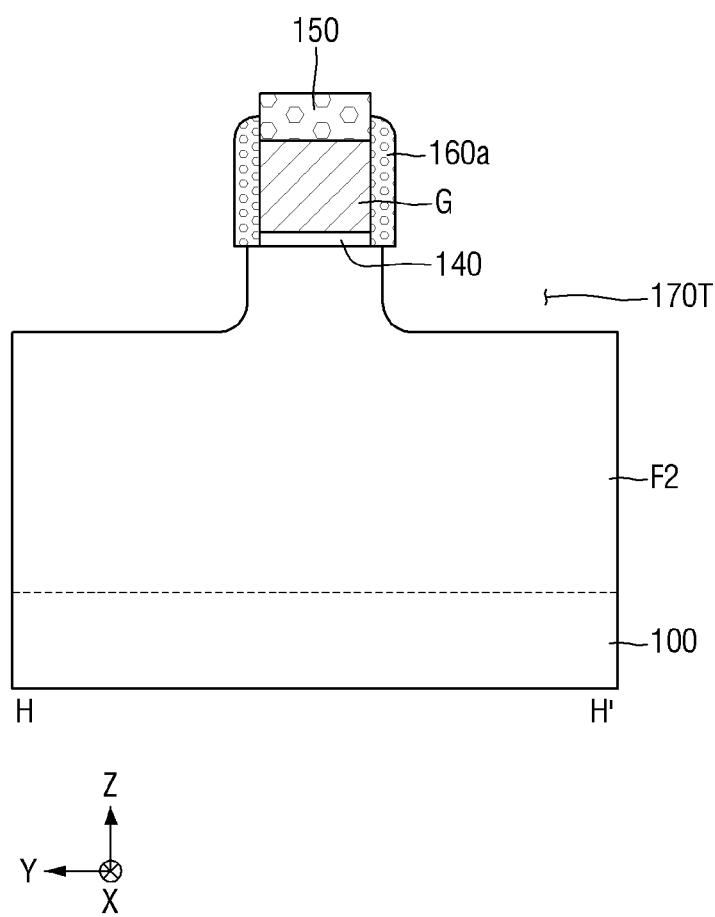
Figure 25:
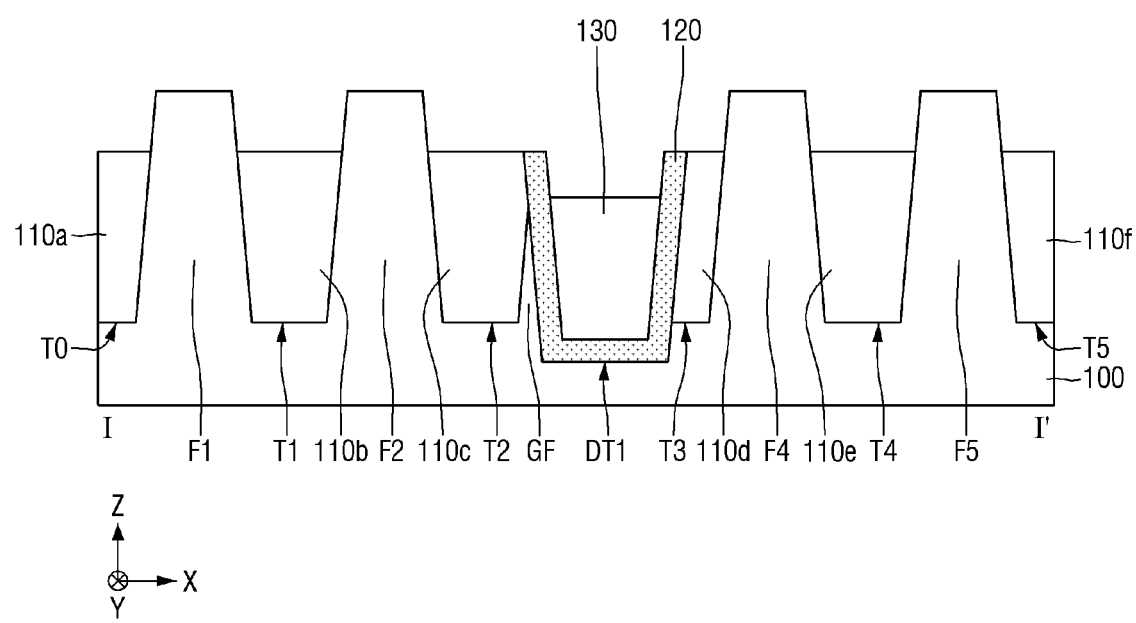

Referring to FIGS. 23 to 25, the spacer layer 160 may be etched, such that the spacer layer 160 may remain on the sidewall of the dummy gate G. The spacer layer 160 may extend in the first direction X along the sidewall of the dummy gate G. The spacer layer 160 may be removed from the whole region other than the sidewall of the dummy gate G.

In the first fin F1, the second fin F2, the fourth fin F4, and the fifth fin F5, source/drain recesses 170T may be respectively formed at opposite sides of the dummy gate G. The process of partly removing the spacer layer 160 and the process of forming the source/drain recesses 170T may be performed concurrently. In some embodiments, the process of partly removing the spacer layer 160 and the process of forming the source/drain recesses 170T may be separately performed. The source/drain recesses 170T may each expose a portion of a lower surface of the spacer layer 160, but is not limited thereto.

Figure 26:
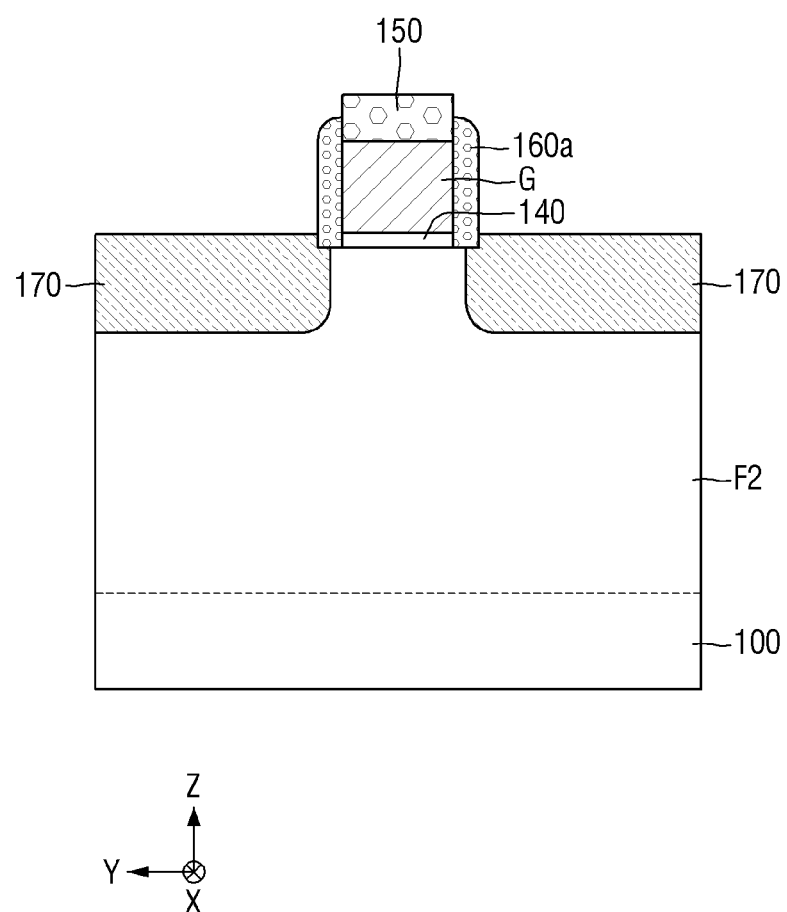
Figure 27:
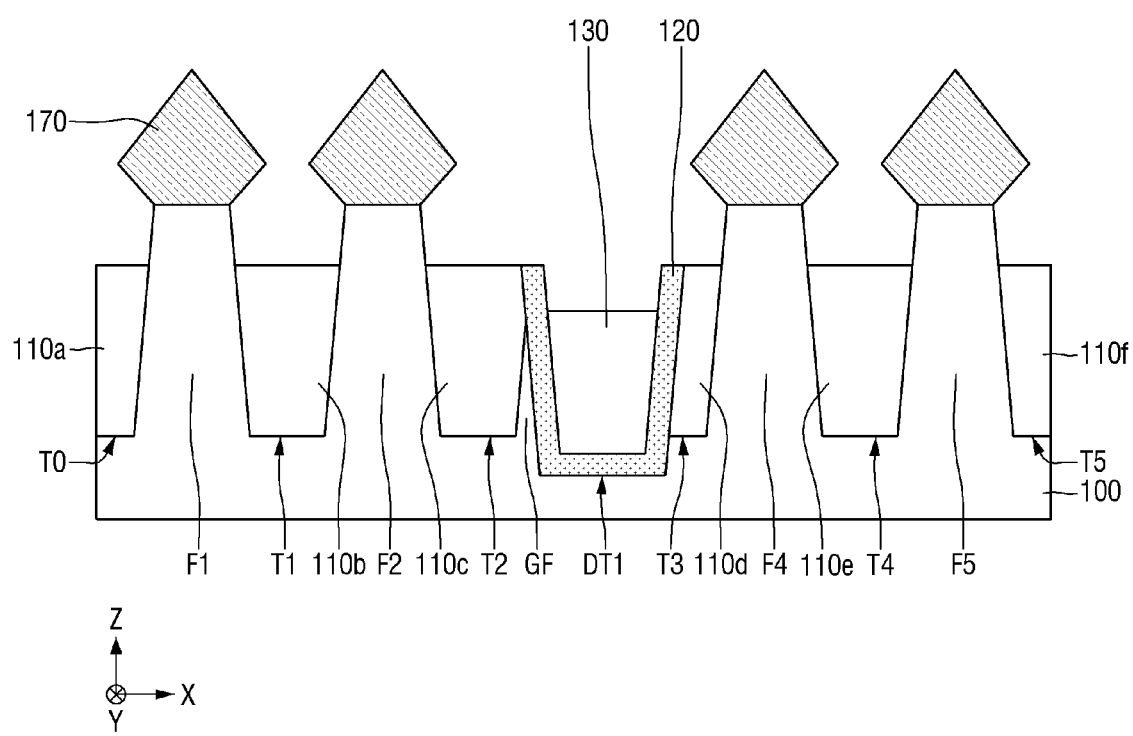

FIG. 26 is a view corresponding to FIG. 24. FIG. 27 is a view corresponding to FIG. 25. Referring to FIGS. 26 and 27, the source/drains 170 may be formed. The source/drains 170 may be respectively formed in the source/drain recesses 170T. The source/drains 170 may each include an epitaxial layer formed by an epitaxial process. The source/drains 170 may be elevated source/drains. In the case of an n-type transistor, the source/drains 170 may each include, for example, a silicon (Si) epitaxial layer or a silicon carbide (SiC) epitaxial layer. The source/drains 170 may each include an Si:P or SiPC doped with a high concentration of phosphorus (P). In the case of a p-type transistor, the source/drains 170 may each include a silicon germanium (SiGe) epitaxial layer. The source/drains 170 may have a polygonal (e.g., diamond), circular or rectangular cross section.

Figure 28:
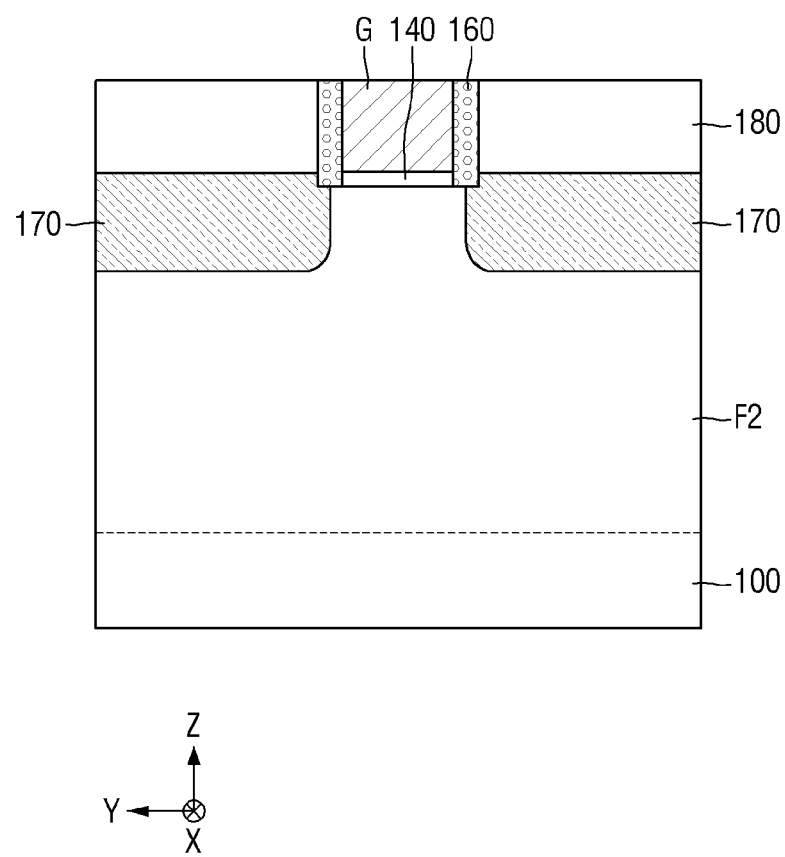
Figure 29:
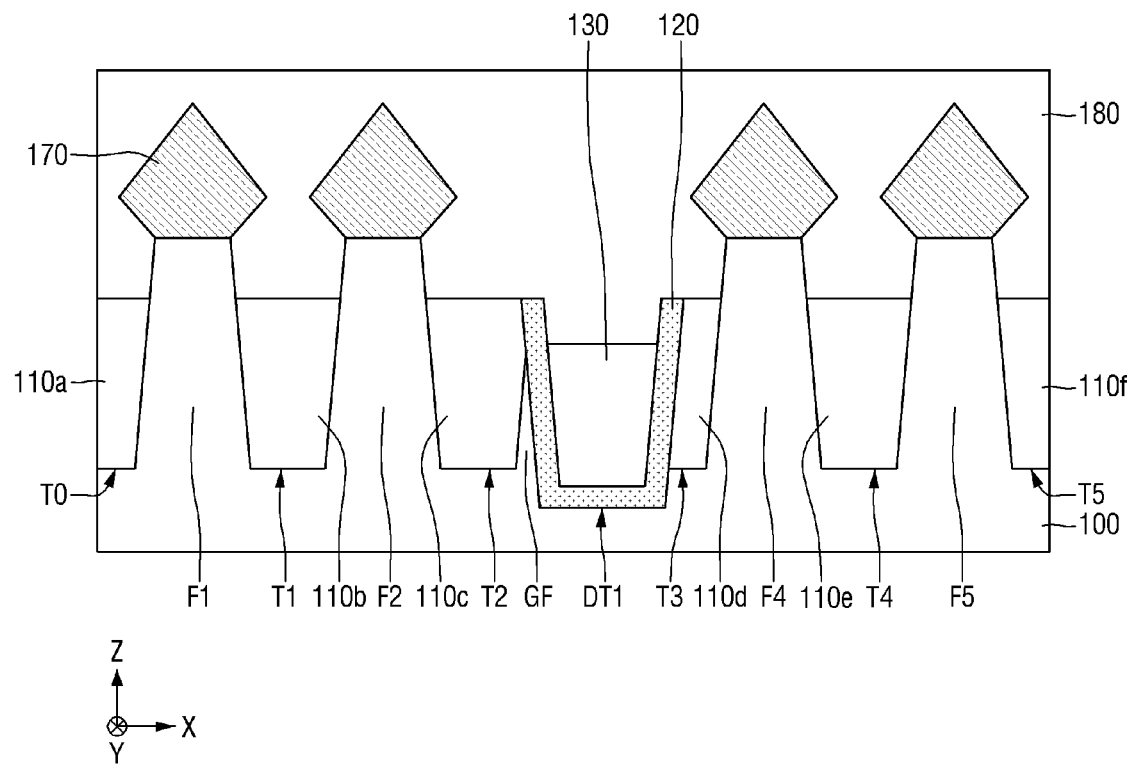

FIG. 28 is a view corresponding to FIG. 26. FIG. 29 is a view corresponding to FIG. 27. Referring to FIGS. 28 and 29, the first interlayer insulation layer 180 may be formed. The first interlayer insulation layer 180 may cover the substrate 100, the source/drains 170, the first to sixth field insulation layers 110a-110f, the first blocking liner 120, and the first fin-cut trench insulation layer 130. The first interlayer insulation layer 180 may include, for example, silicon oxide, silicon nitride, silicon oxynitride, and/or a low-k dielectric material having a lower dielectric constant than that of silicon oxide.

A planarization process may be performed to remove a portion of the first interlayer insulation layer 180, a portion of the spacer layer 160, and all of the capping layer 150. Thus, an upper surface of the first interlayer insulation layer 180 may be coplanar with an upper surface of the spacer layer 160 and an upper surface of the dummy gate G.

Referring again to FIGS. 1, 2, 3A, and 3A, the gate insulation layer 190, the gate electrode 230, the second interlayer insulation layer 240, the silicide 260, and the contact 250 may be formed. The exposed dummy gate G and the dummy gate insulation layer 140 may be removed. The gate insulation layer 190 and the gate electrode 230 may be sequentially formed in a region from which the dummy gate G and the dummy gate insulation layer 140 are removed. The gate insulation layer 190 may include an interfacial layer including silicon oxide and a high-k dielectric layer including a high-k dielectric material.

The gate electrode 230 may include the first conductive layer 210 and the second conductive layer 220. The second conductive layer 220 may be formed on the gate insulation layer 190. The second conductive layer 220 may include a work function adjusting material of n-type or p-type. The work function adjusting material may include, for example, TiN, TaN, and/or TiAlC, but is not limited thereto. The first conductive layer 210 may be formed on the second conductive layer 220. The first conductive layer 210 may include W and/or TiN, but is not limited thereto. A planarization process may be performed, such that the upper surface of the first interlayer insulation layer 180 may be coplanar with an upper surface of the gate insulation layer 190 and an upper surface of the gate electrode 230.

The second interlayer insulation layer 240 may be formed on the first interlayer insulation layer 180. The second interlayer insulation layer 240 may include, for example, silicon oxide, silicon nitride, silicon oxynitride, and/or a low-k dielectric material having a lower dielectric constant than that of silicon oxide.

The contact 250 may penetrate the second interlayer insulation layer 240 and the first interlayer insulation layer 180 and may contact each of the source/drains 170. The contact 250 may extend into each of the source/drains 170. The silicide 260 may be formed at an interface between the contact 250 and each of the source/drains 170. The silicide 260 may improve an interface characteristic between the contact 250 and each of the source/drains 170. The silicide 260 may be formed in each of source/drains 170 and may be directly contact the contact 250. The contact 250 may include a barrier metal contacting the first interlayer insulation layer 180, the second interlayer insulation layer 240, and each of the source/drains 170.

Figure 30:
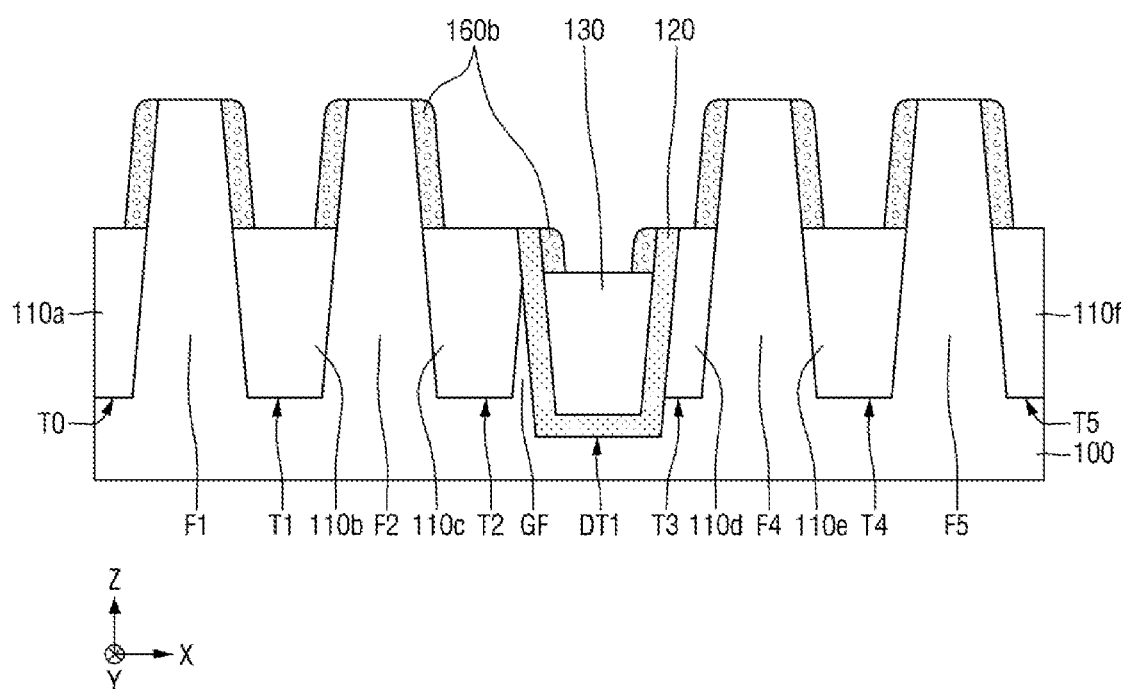
FIGS. 30 and 31 are cross-sectional views illustrating stages in a method of fabricating a semiconductor device according to example embodiments.
Figure 31:
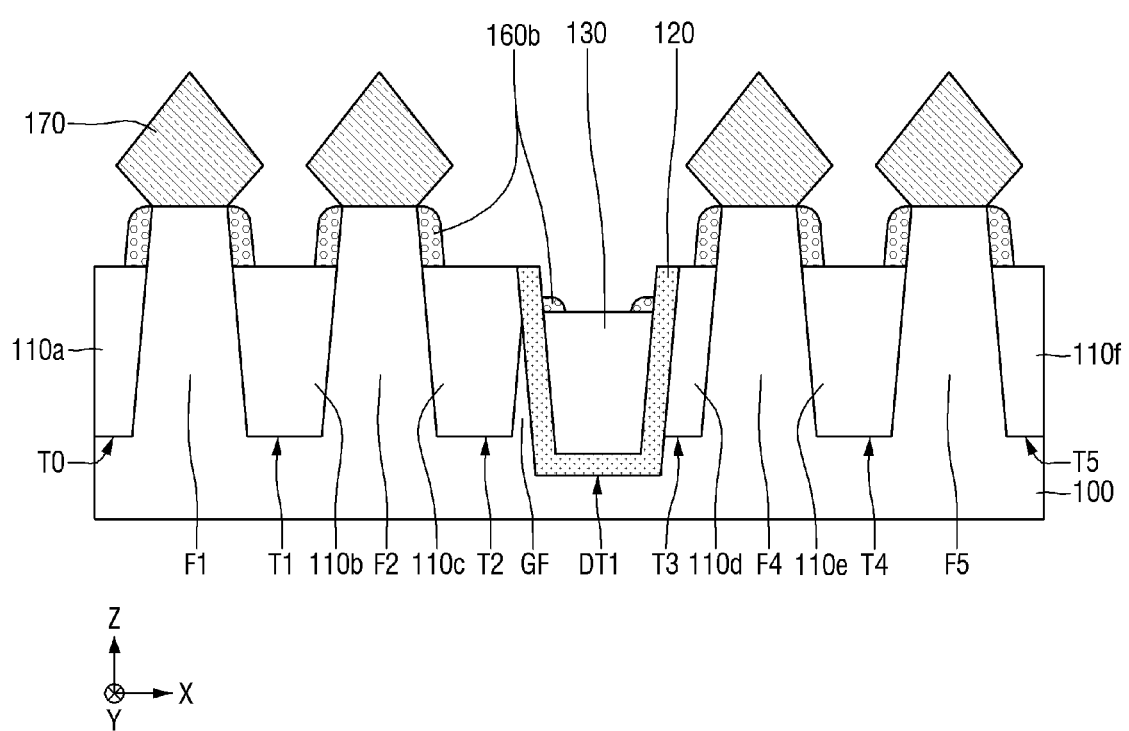

FIGS. 30 and 31 are cross-sectional views illustrating stages in a method of fabricating a semiconductor device according to example embodiments. For easy description, repeat descriptions of items previously described will be described in brief or omitted. The same processes as described with reference to FIGS. 8 to 22 may be performed. Referring to FIG. 30, a gate spacer 160a and the remnant layer 160b may be formed. The spacer layer 160 may be etched, such that the gate spacer 160a and the remnant layer 160b may be formed. For example, the remnant layer 160b may be a remnant left after the spacer layer 160 is etched.

The gate spacer 160a may be formed on each of opposite sidewalls of the gate electrode 230 and may extend in the first direction X. The gate spacer 160a may have the same shape as the spacer layer 160 described with reference to FIG. 1. The remnant layer 160b may extend in the second direction Y from the gate spacer 160a.

The remnant layer 160b may extend in the second direction Y along opposite sidewalls of the first fin F1, the second fin F2, the fourth fin F4, and the fifth fin F5. In this case, the remnant layer 160b may extend in the second direction Y along the opposite sidewalls of the first fin F1, the second fin F2, the fourth fin F4, and the fifth fin F5, below the source/drains 170.

The remnant layer 160b may be formed in the first fin-cut trench DT1. The remnant layer 160b may be formed on an upper surface of the first fin-cut trench insulation layer 130. The remnant layer 160b may extend in the second direction Y along an inner sidewall of the first blocking liner 120 exposed by the first fin-cut trench insulation layer 130.nn The remnant layer 160b may be formed of the same material as the gate spacer 160a and may be integrally coupled with the gate spacer 160a. The remnant layer 160b may be formed in the same process used to form the gate spacer 160a.

Referring to FIG. 31, the source/drains 170 may be formed. The first fin F1, the second fin F2, the fourth fin F4, and the fifth fin F5 may be recessed, and then the source/drains 170 may be formed on the recesses in the second fin F2, the fourth fin F4, and the fifth fin F5. In the recess process, a portion of the remnant layer 160b may be removed. Thus, a portion of the remnant layer 160b in the first fin-cut trench DT1 may be removed, and a portion of remnant layer 160b be left. Thereafter, referring again to FIGS. 6 and 7, the first interlayer insulation layer 180, the second interlayer insulation layer 240, the contact 250, and the silicide 260 may be formed.

While the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A semiconductor device comprising:
    a substrate having first fin and a second fin spaced apart and extending lengthwise in parallel;
    a fin remnant between the first fin and the second fin, extending lengthwise in parallel with the first and second fins, and having a height lower than a height of each of the first fin and the second fin;
    a first field insulation layer disposed between a sidewall of the first fin and a first sidewall of the fin remnant;
    a second field insulating layer on a sidewall of the second fin and spaced apart from the first field insulation layer;
    a blocking liner conforming to a sidewall and a bottom surface of a trench bounded by a second sidewall of the fin remnant and a sidewall of the second field insulating layer; and
    a trench insulation layer on the blocking liner in the trench and having an upper surface lower than upper surfaces of the first field insulation layer and the second field insulation layer.

2. The semiconductor device of claim 1, wherein the blocking liner includes a first portion contacting the trench insulation layer and a second portion not contacting the trench insulation layer.

3. The semiconductor device of claim 2, further comprising a spacer layer contacting the second portion of the blocking liner.

4. The semiconductor device of claim 1, wherein the first sidewall of the fin remnant contacts the first field insulation layer and wherein the second sidewall of the fin remnant contacts the blocking liner.

5. The semiconductor device of claim 1, wherein the blocking liner has an etch selectivity with respect to the trench insulation layer.

6. The semiconductor device of claim 5, wherein the blocking liner includes silicon nitride, polysilicon, silicon carbide, and/or titanium oxide.

7. The semiconductor device of claim 5, wherein the trench insulation layer includes silicon oxide.

8. The semiconductor device of claim 7, wherein a bottom surface of the blocking liner is below bottom surfaces of the first field insulation layer and the second field insulation layer.

9. A semiconductor device comprising:
    a substrate having a fin remnant protruding therefrom, extending lengthwise in a first direction and having opposite first and second sidewalls;
    a first field insulation layer contacting a first sidewall of the fin remnant;
    a second field insulation layer on the substrate and spaced apart from the first field insulation layer;
    a trench bounded by the second sidewall of the fin remnant, a sidewall of the first field insulation layer and a sidewall of the second field insulation layer, the trench extending into the substrate to a depth below a lower surface of the first field insulation layer and the second field insulation layer;
    a blocking liner conforming to a bottom surface and inner sidewalls of the trench; and
    a trench insulation layer on the blocking liner in the trench and having an upper surface lower than an upper surface of the first field insulation layer.

10. The semiconductor device of claim 9, wherein an upper surface of the second field insulation layer is at a higher level than the upper surface of the trench insulation layer.

11. The semiconductor device of claim 9, wherein a width of the first field insulation layer in a second direction transverse to the first direction is greater than a width of the second field insulation layer in the second direction.

* * * * *